(12) United States Patent
Youngbull et al.

(10) Patent No.: US 9,035,174 B2
(45) Date of Patent: May 19, 2015

(54) FORMING GRADED INDEX LENS IN AN ALL ATMOSPHERIC PRESSURE PRINTING PROCESS TO FORM PHOTOVOLTAIC PANELS

(71) Applicant: Nthdegree Technologies Worldwide Inc., Tempe, AZ (US)

(72) Inventors: Tricia A. Youngbull, Tempe, AZ (US); William J. Ray, Fountain Hills, AZ (US); Lixin Zheng, Kirkland, WA (US); Mark D. Lowenthal, Gilbert, AZ (US); Vera N. Lockett, Phoenix, AZ (US); Theodore I. Kamins, Palo Alto, CA (US); Neil O. Shotton, Tempe, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 342 days.

(21) Appl. No.: 13/718,978

(22) Filed: Dec. 18, 2012

(65) Prior Publication Data

US 2013/0153027 A1   Jun. 20, 2013

Related U.S. Application Data

(60) Provisional application No. 61/577,607, filed on Dec. 19, 2011, provisional application No. 61/577,612, filed on Dec. 19, 2011.

(51) Int. Cl.
*H01L 31/054* (2014.01)
*H01L 31/055* (2014.01)
(Continued)

(52) U.S. Cl.
CPC .... *H01L 31/02327* (2013.01); *H01L 31/02322* (2013.01); *H01L 31/02168* (2013.01);
(Continued)

(58) Field of Classification Search
CPC .......... H01L 31/02327; H01L 31/02322; H01L 31/02168; H01L 31/035281; H01L 31/068; H01L 31/055; H01L 31/0524; Y02E 10/52; Y02E 10/545; Y02E 10/546; Y02E 10/547; Y02E 10/548

USPC .......... 136/255, 257, 258, 259, 261
See application file for complete search history.

(56) References Cited

U.S. PATENT DOCUMENTS

2007/0242173 A1   10/2007   Blum et al.
2009/0014056 A1   1/2009   Hockaday
(Continued)

FOREIGN PATENT DOCUMENTS

WO   2009042184 A2   4/2009
WO   2010117280 A1   10/2010

OTHER PUBLICATIONS

International Search Report and Written Opinion, 11 pages.
(Continued)

*Primary Examiner* — James Lin
*Assistant Examiner* — Dujuan Horton
(74) *Attorney, Agent, or Firm* — Patent Law Group LLP; Brian D. Ogonowsky

(57) ABSTRACT

A PV panel uses an array of small silicon sphere diodes (10-300 microns in diameter) connected in parallel. The spheres are embedded in an uncured aluminum-containing layer, and the aluminum-containing layer is heated to anneal the aluminum-containing layer as well as p-dope the bottom surface of the spheres. A phosphorus-containing layer is deposited over the spheres to dope the top surface n-type, forming a pn junction. The phosphorus layer is then removed. A conductor is deposited to contact the top surface. Alternatively, the spheres are deposited with a p-type core and an n-type outer shell. After deposition, the top surface is etched to expose the core. A first conductor layer contacts the bottom surface, and a second conductor layer contacts the exposed core. A liquid lens material is deposited over the rounded top surface of the spheres and cured to provide conformal lenses designed to increase the PV panel efficiency.

23 Claims, 10 Drawing Sheets

(51) Int. Cl.
*H01L 31/103* (2006.01)
*H01L 31/0232* (2014.01)
*H01L 31/0216* (2014.01)
*H01L 31/0352* (2006.01)
*H01L 31/068* (2012.01)
*H01L 31/075* (2012.01)
*H01L 31/18* (2006.01)

(52) U.S. Cl.
CPC ...... *H01L31/035281* (2013.01); *H01L 31/055* (2013.01); *H01L 31/068* (2013.01); *H01L 31/075* (2013.01); *H01L 31/1804* (2013.01); *Y02E 10/548* (2013.01); *Y02E 10/547* (2013.01); *Y02E 10/52* (2013.01)

(56) References Cited

U.S. PATENT DOCUMENTS

2010/0167441 A1 7/2010 Ray et al.
2011/0226332 A1 9/2011 Ford et al.

OTHER PUBLICATIONS

PCT/US12/70403 Written Opinion of the International Preliminary Examining Authority in response to Chapter II Demand filed, Dec. 23, 2013.

Kevin C Krogman et al., "Anti-reflective optical coatings incorporating nanoparticles", Institute of Physics Publishing Nanotechnology 16, Apr. 15, 2005, pp. S338-S343, IOP Publishing Ltd., UK, <stacks.iop.org/Nano/16/S338>.

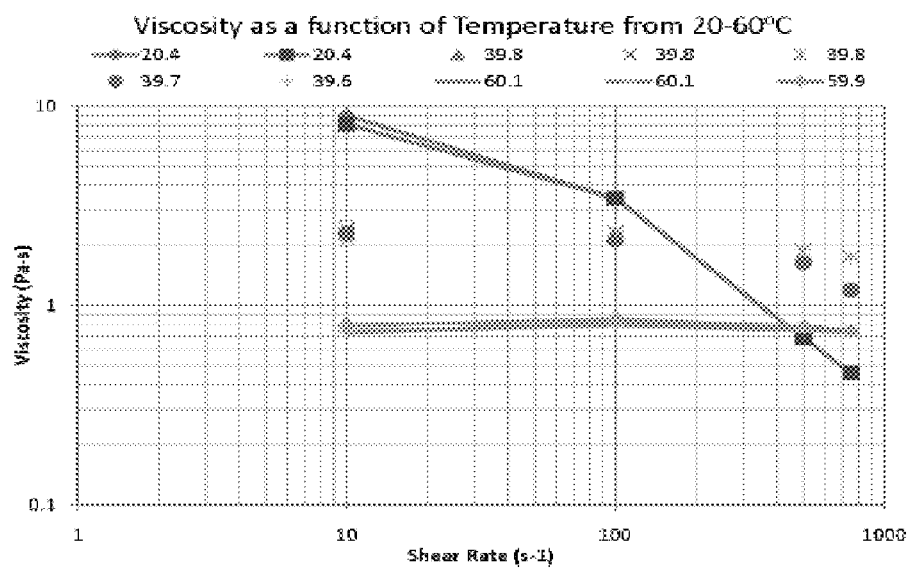
Fig. 28
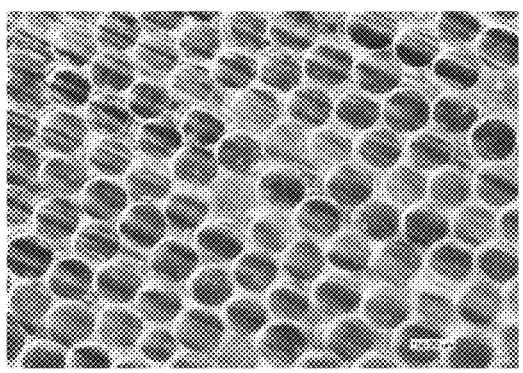 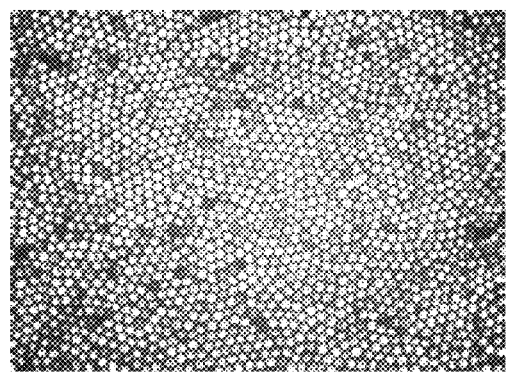
Fig. 29A  Fig. 29B

FORMING GRADED INDEX LENS IN AN ALL ATMOSPHERIC PRESSURE PRINTING PROCESS TO FORM PHOTOVOLTAIC PANELS

CROSS-REFERENCE TO RELATED APPLICATIONS

This application is based, in part, on U.S. provisional application Ser. No. 61/577,607, filed Dec. 19, 2011, entitled Photovoltaic Panel With Graded-Index Lens, assigned to the present assignee and incorporated herein by reference.

This application is also based, in part, on U.S. provisional application Ser. No. 61/577,612, filed Dec. 19, 2011, entitled Photovoltaic Panel With Quantum Dots Deposited Directly On Silicon Solar Cell Layer, assigned to the present assignee and incorporated herein by reference.

FIELD OF THE INVENTION

This invention relates to forming photovoltaic (PV) panels, also known as solar panels or solar cells, and, in particular, to a technique for forming a silicon-based PV panel using an all atmospheric pressure printing process.

BACKGROUND

Crystalline and multicrystalline silicon photovoltaic panels are traditionally fabricated using a semi-automated process that requires expensive manufacturing equipment, is relatively labor-intensive, and requires vacuum processing tools such as vacuum evaporators and plasma enhanced chemical vapor (PECVD) deposition chambers. The invention described herein describes a continuous, roll-to-roll crystalline PV manufacturing method that requires no vacuum tools. Roll-to-roll (R2R) manufacturing of PV panels have been demonstrated using plasma deposited amorphous silicon and slot-die coated copper indium gallium diselenide, but these processes have not been truly continuous, e.g., R2R equipment is used but the web is wound up and transported to multiple process stations. Moreover, the cost of manufacturing per Watt of generated power from these thin film panels has been financially unsustainable.

In the present invention, the PV panels are made of high efficiency crystalline silicon microspheres 10-150 microns in diameter, which greatly reduces silicon consumption per panel area. The PV panel makes very efficient use of the silicon since the light-incident surface area-to-volume ratio is 2-3 orders of magnitude greater than planar silicon. The small sphere size also allows the microspheres to be dispersed in an ink system that is coated on a web into a closed packed monolayer. High throughput, low-cost coating of the microspheres and other functional layers, and formation of the PN junction are all carried out in a continuous, atmospheric pressure roll-to-roll process.

US patent application publication no. US2010/0167441, entitled, Method of Manufacturing a Light Emitting, Photovoltaic or Other Electronic Apparatus and System, is assigned to the present assignee and incorporated herein by reference. The publication describes various techniques to form light emitting diode (LED) sheets and photovoltaic (PV) panels using arrays of semiconductor microdiodes. In particular, the PV panels are comprised of microspheres and may be on the order of 20-40 microns in diameter. Several methods of manufacturing silicon spheres are known and include forming spheres from molten silicon in a drop tower, patterning silicon particle agglomerates on a substrate and melting them to form spheres by surface tension, or dropping powder through a plasma reactor.

To-date, spherical PV modules have been limited by a means to rapidly produce a nearly closed packed monolayer of silicon spheres. Monolayer formation of micrometer or nanometer range spheres has been a significant area of research across a number of different disciplines over the years. Rapid, inline formation of true monolayers of micrometer spheres from a high solids fluid is difficult and, within an industrial setting, has remained a difficult task. Monolayers occur within very narrow control ranges where a small variance in print conditions favor either sparse layers or layer doubling.

Lee et al, US patent application 2011/0117694 A1 describes an inkjet printing process to make silicon microsphere diodes in a monolayer but not in a closed packed array, and inkjet printing is relatively a low-throughput printing process compared to the coating processes described herein. Moreover, the PV panel process uses vacuum tools, specifically plasma enhanced chemical vapor deposition to form the electrodes. What is needed is a high throughput (e.g., 10-20 ft/min) R2R monolayer coating process of silicon microspheres.

Back surface field (BSF) formation in spherical PV diodes at low temperature (<640° C.) is also needed to increase panel efficiency and maintain the structural integrity of the web during a R2R process. A BSF is an aluminum rich region in a silicon solar cell that is capable of providing a 1-3% total power conversion efficiency gain in a solar panel. Typically, the rear contact for mono-crystalline and multi-crystalline silicon solar cells is formed by screen printing an aluminum paste on the back-side of a silicon wafers and firing them at 800-900° C. to form an ohmic contact and a BSF. U.S. patent application Ser. No. 13/587,380 describes an aluminum-based ink. This ink is utilized to form a BSF in silicon microspheres using rapid annealing at a peak temperature of 600° C. on a moving web.

Various methods of doping the silicon spheres to form diodes are also known. Typically, lightly doped p-type silicon (1-10 Ohm-cm) is highly doped (1e-4 Ohm-cm or less) on the outer surface with phosphorus, to form a pn+ diode. U.S. Pat. No. 7,214,577 describes using standard diffusion of phosphorus dopants into 1-2 mm diameter silicon spheres before forming the PV panels. This is a batch process that requires a special process chamber to contain hazardous gas, and later the spherical diodes must be etched to remove a portion of the n+ region. The method described in the present disclosure forms the PN junction in-situ during the R2R process using laser annealing at atmospheric pressure. This is the first time laser annealing is used to form PN junctions on spherical silicon in-line, and it removes the need for etching the diode in later processes.

The anodes and cathodes of the diodes are ohmically connected to printed conductors to form an array of parallel-connected diodes in a PV panel. Panels may be connected in a combination of series and parallel to achieve the desired electrical characteristics.

Further, the panels described in US patent application publication no. US2010/0167441 are formed using various processes that are not practical with a roll-to-roll printing process. This increases the cost of the panels and decreases manufacturing throughput of the panels. For instance, a substrate with pre-formed channels in which the spheres ultimately reside is used. A paste conductor and the spheres that are not deposited in the channels must be scraped off the substrate, increasing the difficulty and cost of forming the panels.

Further, the processes of US patent application publication no. US2010/0167441 generally deposit pre-formed lenses over the diode array, where the shapes of the lenses are not optimized for the spheres and where the lenses are difficult to optimally position with respect to the spheres. Due to the large variations in indices of refraction between the silicon, lens, and air, there is significant reflection of light. U.S. Pat. No. 8,013,238 aligns lenses to millimeter sized spherical diodes with a vertical, elastomeric standoff, requiring the spheres be spaced in a square array, millimeters apart, which significantly decreases the active area of the photovoltaic panel. In the present application, Applicants disclose aligned lenses with a graded refractive index over a closed packed array of silicon microsphere diodes to reduce reflection of light from the silicon and allow for a more efficient PV panel. European patent application EP 1 586 121 B1 describes an antireflection coating for spherical PVs but the material deposition method is a vacuum process, so a continuous roll-to-roll process cannot be performed.

Other improvements over the processes of US patent application publication no. US2010/0167441 are also desirable, which improve the performance of the panels and simplify processing.

What is needed is an all atmospheric pressure technique to fabricate a highly efficient PV panel with an antireflective, graded index lens at a relatively low cost, using a roll-to-roll printing process.

SUMMARY

In one embodiment of an all-atmospheric pressure process to form PV panels using an efficient roll-to-roll fabrication technique, an aluminum foil substrate is provided on a roll. As the metal substrate is unwound through the printing press (referred to herein as the web), a conductive adhesion layer, such as an aluminum-containing ink, is coated on the substrate, immediately followed by coating a silicon sphere slurry on the uncured aluminum-containing ink. The silicon spheres may be 10-300 microns in diameter and are pre-doped to be n-type or p-type, or have an intrinsic conductivity type. Lightly doped p-type microspheres are assumed in the example. The slurry is spread thin, such as by a roller, blade, or air knife, to form a closed packed monolayer of silicon spheres, and the spheres become embedded in the aluminum-containing ink. The aluminum-containing ink is then cured (e.g., ink's solvent evaporated) and annealed (aluminum particles sintered) by an in-line furnace or other heat source. The annealing causes the contact area of the silicon spheres to alloy with the aluminum ink to form a back surface field, or highly doped $p^+$ silicon, and form an ohmic contact with the aluminum. This $p^+$ layer reduces electron-hole recombination at the sphere's back surface and thus increases efficiency by a total of 1-3 percentage points.

The substrate does not use channels for aligning the spheres and containing the aluminum-containing layer, which greatly simplifies the formation of the panel and reduces waste.

A dielectric is spray-coated over the spheres. The dielectric is designed to wet off (or wick off) the top of the microspheres by capillary action and surface tension to form a 1-15 micron thick coating between the microspheres, and then cured. A residual layer of dielectric approximately 150 nm or less remaining on the tops of the silicon spheres is not detrimental to forming the PN junction.

Phosphoric acid, phosphorus-doped glass, phosphorus-doped silicon nanoparticles, or a phosphorus-containing silicon precursor is spray-coated over the spheres and heated, such as by a laser, to diffuse the n-type dopants into the top surface of the spheres, forming diodes. Residual phosphorus dopant is then washed from the tops of the spheres.

A transparent conductor, such as a conductive ink, is then slot die coated over the surface of the panel including over the exposed n-type layer of the spheres. If the conductor material is deposited as a liquid, the conductor viscosity may be sufficiently low that it pools around the lower portion of the spheres by gravity, surface tension, and capillary action, and retracts from over the spheres to form a conducting network. Such pooling reduces the resistance of the conductor and avoids issues with the conductor covering the diode and reducing optical transmission.

Thin metal bus bars are then printed in selected areas over the pooled conductor layer and the spheres, forming many low resistance parallel strips running along the length of the PV panel. A few wider and thicker, orthogonal metal bus bars may then be formed in contact with the thin bus bars to carry the solar cell's cathode current to electrical connectors at an edge of each PV panel. The aluminum substrate carries the anode current to the connectors.

Quantum dots of silicon or other types of quantum dots are then coated over the top surface of the spheres to conform to the shape of the spheres. The quantum dots absorb UV light and emit the light in visible wavelengths. The silicon diodes convert the added visible light into current, so the incident UV light is not wasted, and solar cell heating is reduced.

To reduce reflection and to form an environmental barrier, a layer or sequence of layers of high-index of refraction nanoparticles (e.g., doped glass beads or other high-index particles such as titanium dioxide) in an environmentally robust transparent binder is deposited over the silicon spheres, creating an omnidirectional, graded (or stepped) index antireflection coating. A nanoparticle, as used herein, has a diameter of less than one micron. The particles preferably have an average diameter of less than 100 nm. The sizes of the nanoparticles are smaller than the wavelengths of visible light to limit scattering by the nanoparticles. The particles have an index of refraction of about 1.7-2.4. The transparent binder has an index of refraction that is lower than the index of refraction of the nanoparticles, but the composite creates a greater effective index than the binder alone and is tuned by changing the concentration of the high-index nanoparticles. Without additives, increasing the refractive index of an optically transparent polymer above 1.7 is difficult to achieve. The layer may contain a mixture of one or more nanoparticle types of different refractive indices, and the concentrations of the different nanoparticles may vary between the upper portion and the lower portion of the lens. The different index nanoparticles may have different sizes and/or masses to create the different concentrations as the nanoparticles settle through the liquid at different rates. A single lens coating layer may be preferred to simplify the number of coating steps during the roll-to-roll process. In another embodiment, multiple layers with different bulk refractive indexes are coated and cured on top of each other to more precisely grade the refractive index of the lens.

In one embodiment, a lower index (e.g., n=1.4) PVDF (polyvinylidene difluoride) layer, or other suitable transparent polymer, containing matched index (e.g., n=1.4) particles (e.g., transparent doped glass beads) is next deposited over the nanoparticle layer. This lower index layer may have an effective index of 1.4 or less (e.g., 1.3). These particles may have an average diameter between 1-10 microns. These particles, being preferably much harder than the binder, desirably provide abrasion resistance. Such protection is a very important advantage in PV panels.

The quantum dot layer and the lens layers conform to the rounded top surfaces of the diodes, creating an optimal optical structure with minimum reflection.

The roll is then cut to form individual PV panels, each panel containing millions of silicon diodes connected in parallel, and an array of the PV panels is bonded to a support structure to form a module. The PV panels may be electrically connected in any combination of series and parallel to achieve the desired voltage and current characteristics.

In another embodiment, the p-n silicon diodes are formed prior to being coated on the substrate. p-type doped or undoped silicon spheres are initially provided. An outer $n^+$-type layer is then formed on the spheres such as by subjecting the spheres to phosphoric acid in a batch barrel process. The spheres are then applied to an uncured aluminum-containing ink layer on an aluminum substrate, and the ink is sintered to make electrical contact between the bottom portion of the $n^+$-type layer and the aluminum-containing ink.

A dielectric layer is then coated and cured, which wets off the top of the microspheres by capillary action and surface tension to form 1-15 micron thick coating between the microspheres.

The top surfaces of the diodes are then etched away, exposing the inner p-type silicon (assuming the spheres were initially doped). A further doping of the p-type silicon may be conducted if needed, such as for ohmic contact and to form a front surface field, or if the spheres were not initially p-doped. A transparent conductor is then printed to contact the p-type silicon. The remaining processes may be those described above.

In yet another embodiment, the p-n silicon diodes are formed prior to being deposited on the substrate, as described above, with a p-type core and an $n^+$-type outer layer. The spheres are then printed on a dielectric layer, such as an adhesive tape. The upper $n^+$-type layer of the spheres is then etched to expose the p-type silicon. A layer of aluminum-containing ink is then printed over the panel. The aluminum-containing ink is heated to flow the ink between the spheres so that the aluminum makes ohmic contact with the $n^+$-type bottom layer of the spheres. The aluminum also creates a $p^+$-type top surface of the spheres.

Any aluminum-containing ink remaining in contact with the top $p^+$-type silicon is removed by wet etching.

If there is concern about diffusion between the adjacent $p^+$ and $n^+$ regions, a thin dielectric layer may be formed around each sphere between the $n^+$-type region and the exposed p-type region, prior to depositing the aluminum-containing ink layer, to act as a separator after the $p^+$-type top surface of the spheres is formed.

A low temperature dielectric is then printed over the panel that wets off (or wicks off) the tops of the microspheres by capillary action and surface tension (and pools around the perimeters of the microspheres) to form a 1-15 micron thick coating between the microspheres, exposing the $p^+$-type silicon.

A transparent conductor layer is then coated over the panel, such as by slot die coating. The conductor layer is then heated to sinter conductive particles in the layer and to make ohmic contact with the $p^+$-type silicon. There may be desirable pooling of the transparent conductor material around the sides of the $p^+$-type silicon.

Metal bus bars are then printed to create a low resistance path to the $p^+$-type silicon via the transparent conductor.

A quantum dot layer and graded lens may then be formed, as previously described.

Anode and cathode connectors are then formed leading to the aluminum-based anode layer and the transparent conductor cathode layer.

The panels are then separated, mounted on a support structure, and electrically interconnected.

Other embodiments are described in the detailed description. All steps may be performed under atmospheric pressure conditions.

BRIEF DESCRIPTION OF THE DRAWINGS

FIG. 4 also illustrates the silicon sphere layer and conductor layer being annealed to form a back surface field in the silicon spheres.

FIG. 28 shows the viscocity behavior of the silicon microsphere slurry as a function of shear rate at slurry temperatures ranging from 20° C.-60° C. The slurry is highly thioxotropic at room temperature but exhibits much less shear thinning at 40° C. Some solvent is lost at 60° C. which results in a slight increase in viscosity at 100 s$^{-1}$.

FIGS. 29A and 29B are optical images at different magnifications of a closed packed monolayer of 63-75 micron microspheres coated on an aluminum web. The microspheres form a closed packed monolayer and can be within 10-150 microns in diameter with a +/−10 micron variance is diameter.

Elements that are similar or identical in the various figures are labeled with the same numeral.

DETAILED DESCRIPTION

One embodiment of the invention is a process for forming a thin PV panel (or solar cell) typically containing millions of small, substantially spherical silicon diodes electrically interconnected in parallel. Electricity is generated by the panel due to the photovoltaic effect. A pn junction is fabricated in lightly doped silicon, typically p-type and referred to as the base, by diffusing electron-rich or electron-deficient atoms to a depth of approximately 1 micron, typically forming a doped n-type layer referred to as the emitter. Electrical contact is made to the emitter and base on either side of the pn junction. At this junction, a depletion region forms from the presence of ionized donors and acceptors. As photons are absorbed from sunlight, free carriers are generated. These photogenerated carriers diffuse and drift to the depletion regions of the p-n junction, drift across the junction under the built-in electric field, and are collected at the electrodes, resulting in a net photocurrent. Groups of the diodes may be connected in a combination of series and parallel to create a desired operating voltage and current. The power may be used to, for example, feed into the utility grid or charge a battery.

Only photons with energies equal to or somewhat greater than the band gap of silicon (~1.1 eV) are converted to electricity by the silicon. UV light has a much greater energy than the bandgap, so much of this absorbed energy is wasted as heat. There is also significant reflection by the silicon due to the large differences in the indices of refraction between air (n=1) and silicon (n=about 4 for visible light). The reflected sunlight is thus wasted. These are only some of the reasons why silicon-based PV panels have relatively low power conversion efficiency, typically less than 20%.

The below-described embodiments illustrate various atmospheric pressure printing processes for forming an efficient PV panel. There is no need for a vacuum chamber, such as for metal depositions, dielectric depositions, etching, etc., resulting in the PV panel fabrication process being relatively simple and inexpensive to implement. This process enables a high throughput roll-to-roll manufacturing technique. Further, the process makes very efficient use of silicon.

Figure 1:
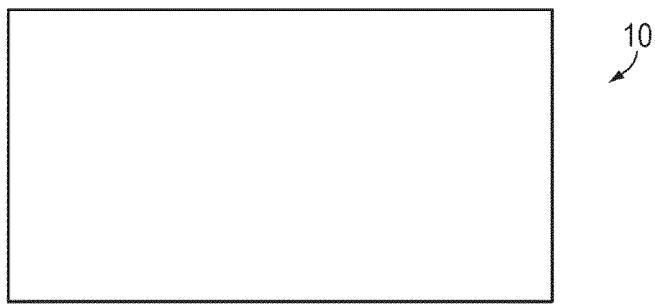
FIG. 1 is a top down view of a starting thin metal foil substrate. The substrate, forming a panel or a cell, may be any size for a roll to roll all-atmospheric pressure printing process.

FIG. 1 is a top down view of a starting substrate 10. In the example, the substrate 10 is a flexible aluminum foil and used to conduct current. In another embodiment, the substrate 10 is any other metal, such as stainless steel, copper, brass, or other alloy. The substrate 10 may instead be a dielectric, such as a polymer sheet. The substrate 10 may be any size, such as 9 inches by 18 inches. Preferably, the substrate 10 is provided on a roll, and the technique described is performed as a roll-to-roll process under atmospheric pressure conditions. In the preferred embodiment, no channels are formed in the substrate 10.

Figure 2:
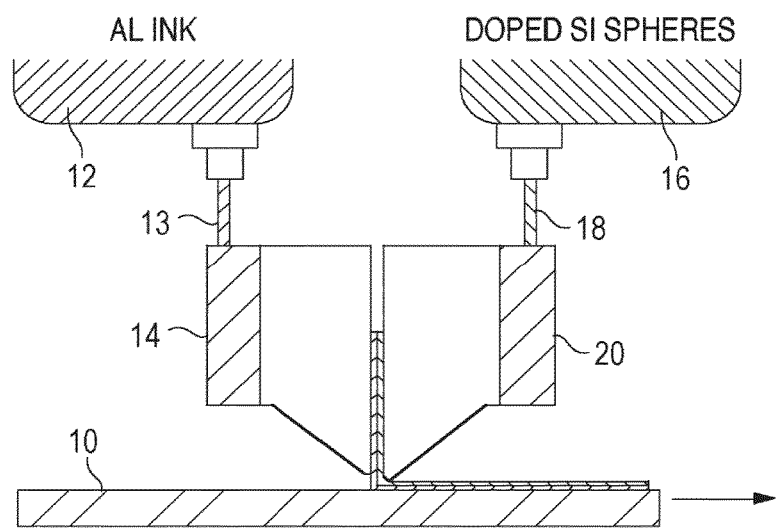
FIG. 2 illustrates an aluminum-containing ink or paste layer being slot die coated immediately prior to a layer of silicon spheres being coated, such that the spheres overlie the uncured conductor layer. These layers may be applied by other means, such as rotary screen printing or knife-over-roll coating.

In FIG. 2, a conductive layer is formed immediately followed by depositing a silicon sphere slurry. In another embodiment, the conductive layer can be cured prior to depositing the silicon spheres. FIG. 2 illustrates a slot die coating process, although alternative printing or coating methods (e.g., knife-over-roll coating) are envisioned. A source 12 of aluminum-containing paste or aluminum-containing ink 13 is provided to a first slot die head 14. The paste can also be a combination of aluminum and silicon or other materials. The first slot die head 14 may optionally heat the aluminum-containing ink 13, and a pump causes the ink 13 to be ejected from a long narrow slot in the first slot die head 14. Slot die heads are well known. The location and amount of the deposited aluminum-containing ink 13 is thus carefully controlled and may be used to deposit rows of conductor layers.

A source 16 of doped or intrinsic silicon spheres in a solvent system (silicon ink 18) is provided to a second slot die head 20, which also may be heated to control viscosity, and deposited onto the aluminum-containing ink 13 prior to curing of the aluminum-containing ink 13. The viscosities of the inks 13 and 18 and percentage of the particles in the solvents may be controlled to optimize spreading of the ink and the packing density of the deposited particles. The slot die heads 14 and 20 may be connected together in what is termed a dual-slot die head for precise alignment of the inks 13 and 18.

In one embodiment, thousands of the doped spheres are deposited across the width of the substrate 10. The spheres are ideally packed hexagonally (i.e., each sphere has 6 spheres surrounding it in a horizontal plane) to provide the maximum number of spheres per unit area. Monolayers occur within very narrow control ranges where a small variance in print conditions favor either sparse layers or layer doubling. These difficulties are due to both the rheology of the fluid and the physical limits of either doctor blade coating or slot die coating of such highly shear thinning materials.

FIG. 28 shows the shear thinning properties of the silicon sphere slurry as a function of temperature. By coating the ink at 40° C., shear thinning is minimized, so the formation of a monolayer is possible.

Moreover, by using the wet on wet approach (e.g., wet spherical laydown on a wet conductive "glue" layer), a closed packed or near perfect monolayer is made at 213 cm/min. FIGS. 29A and 29B show the formation of a closed packed monolayer of microspheres with diameters of 63-75 microns. This process has been proven with microspheres ranging in size from 10-150 microns in diameter, but a high packing density requires a total variance in diameter of at most 20 microns. The combination of both knife over roll coating and slot die coating allows a significantly enhanced coating control range and is an innovation in high speed coating of shear thinning fluids.

In contrast to this step, the adhesive layer in the US publication 2010/0167441, deposited over a flat substrate (no channels or cavities), is not a metal but is, for example, a conductive polymer. The resistance of an aluminum layer is lower than that of a conductive polymer, and the aluminum can be used to dope the silicon with p-type dopants.

Figure 3:
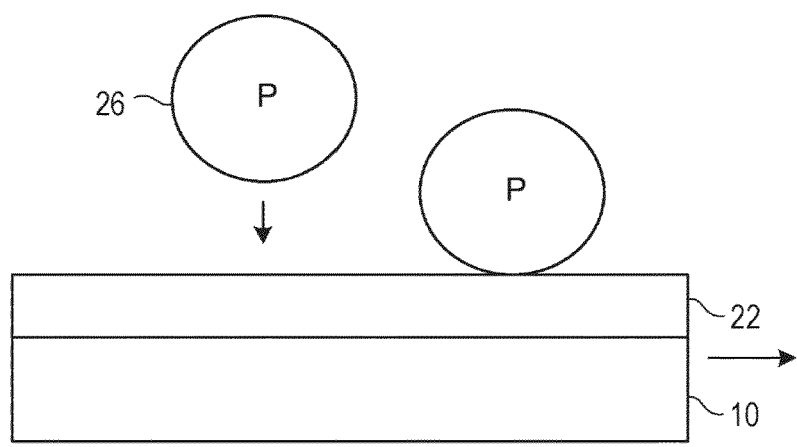
FIG. 3 is a cross-sectional view of the substrate along a row of p-type silicon spheres, illustrating the silicon spheres being deposited on the uncured conductor layer to form a closed packed monolayer. The processes will be shown performed on only a single sphere for simplicity, although each step of the process may be simultaneously performed over the entire surface of the PV panel.

FIG. 3 is a cross-sectional view of the substrate 10, showing the coating of the aluminum-containing conductor layer 22 followed by the coating of p-type silicon spheres 26. N-type, un-doped, or silicon spheres with pre-formed pn junctions may be used instead. The formation of silicon spheres is described in U.S. Pat. No. 5,556,791. In one embodiment, the spheres 26 have a mean diameter somewhere between 10-300 microns. The spheres 26 will typically not be perfect spheres so are assumed to be substantially spherical.

If screen printing is used to form the various layers described herein, the processes may be performed over a large surface of the substrate 10 while the substrate 10 is stationary. In screen printing, a fine mesh has formed on it a mask layer, such as an emulsion, that is patterned using conventional photolithographic processes. The mesh is then laid over the substrate 10. Then the liquid or paste comprising the material to be deposited is squeegeed over the mesh to force the liquid/paste through the openings in the mask to deposit the liquid/paste on the substrate 10 surface. The deposited material is cured, such as by drying by heat.

Figure 4:
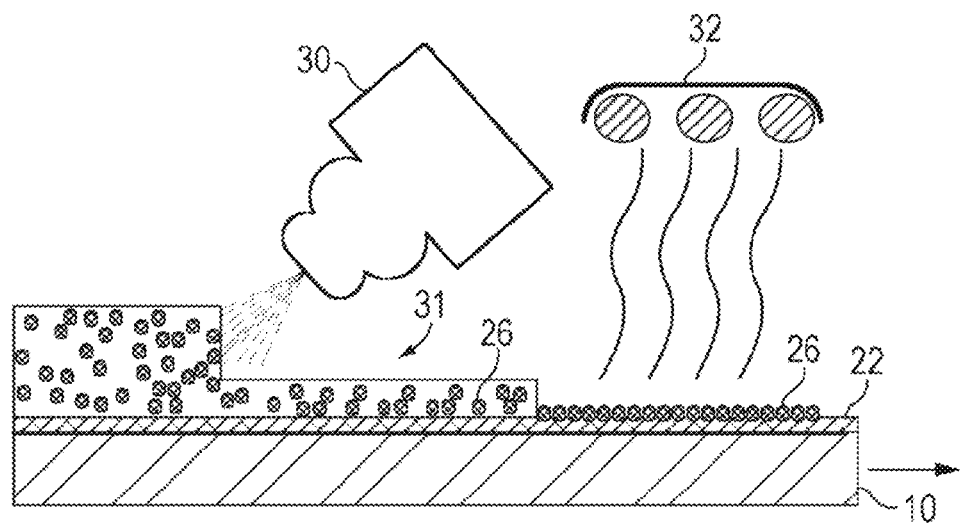
FIG. 4 illustrates an air knife evaporating the solvents from the silicon sphere slurry to aid in the formation of a thin layer, such as a monolayer, while forcing the spheres into the uncured conductor layer.

FIG. 4 illustrates an optional air knife 30 that spreads the silicon ink layer 31 to form a thin layer (e.g., a monolayer) of the spheres 26, while forcing the spheres 26 into the uncured conductor layer 22. The air knife 30, blowing heated filtered air or inert gas, also partially evaporates the ink solvent. Accordingly, there is synergy in using the air knife 30 versus a nip roller or blade. The air knife 30 may be directed normal to the substrate 10 or at an angle. In one embodiment, the air knife 30 blows a narrow-angle (a knife edge) of air. In other embodiments, any type of spreader may be used. In another embodiment, depending on the deposition technique, no spreader is needed.

Figure 5:
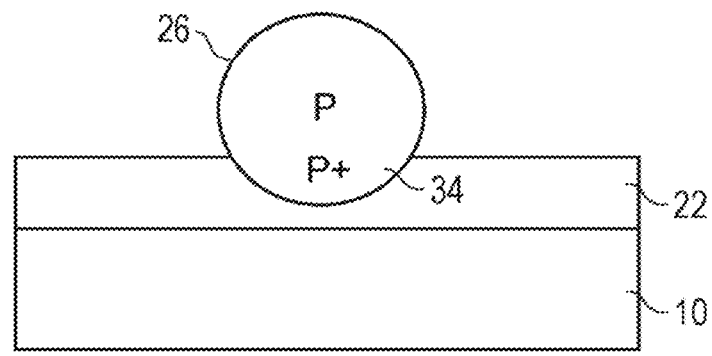
FIG. 5 illustrates the silicon spheres bonding to the conductor layer after the process of FIG. 4.
Figure 30:
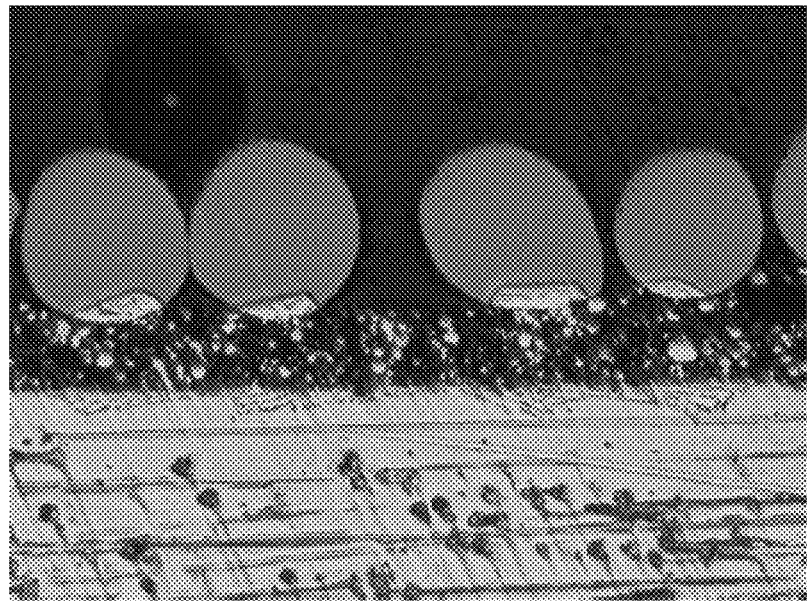
FIG. 30 is an optical image of cross-sectioned silicon microspheres bonded to Al-containing ink coated on an Al foil substrate. The interface between the ink and the silicon microspheres shows the formation of a p+ region or back surface field region.
Figures 31A, 31B, 31C:
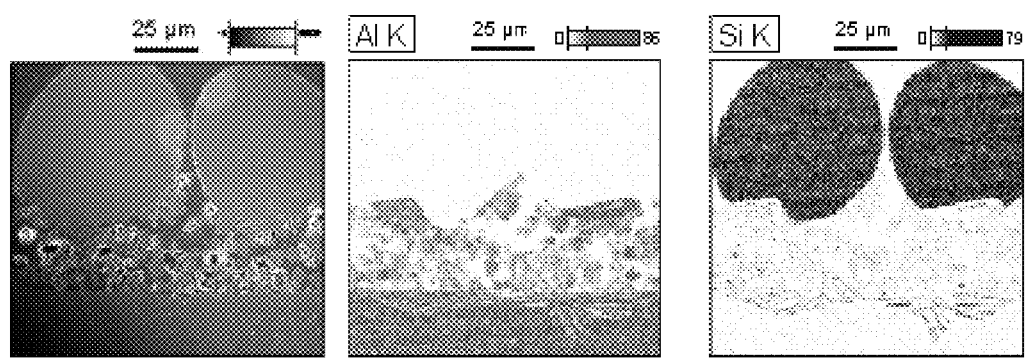
FIG. 31A is a scanning electron microscope image of a cross-section of the monolayer of silicon spheres embedded in the cured Al ink.
FIGS. 31B and 31C are energy dispersive x-ray spectroscopy images taken in a scanning electron microscope showing an alloyed region (p+) in the silicon microspheres (FIG. 31B) and an alloyed (silicon-rich phase) region in the aluminum substrate (FIG. 31C).

FIG. 4 also illustrates the silicon ink layer 31 and conductor layer 22 being cured and annealed in a two-step process during a roll-to-roll process. The curing step evaporates the ink solvent. A heater 32 is shown. The heater 32 may be any suitable heater, including a rapid annealing system. The annealing sinters the aluminum particles in the conductive layer 22 together, forms a back surface field in the silicon (a $p^+$ region), and bonds the silicon to the conductive layer, providing both mechanical and electrical connectivity to the underlying substrate. FIG. 5 illustrates the silicon spheres 26 being embedded in the cured conductive layer 22 after the process of FIG. 4 to create a large contact area. The $p^+$ area 34 forms during the Al annealing step wherever the Al is in contact with the silicon spheres 26. The Al atoms diffuse into the silicon, forming the highly doped $p^+$ area 34 and creating ohmic contact. Cross-sectioned images of silicon microspheres bonded to the Al ink and substrate after this annealing process are shown in FIGS. 30 and 31A-31C. In FIG. 30, the "bright" region in the bottom of the silicon microspheres are the BSF regions and are proven to be Al-rich "dark regions" as shown in the electron dispersive spectroscopy (EDS) micrograph in FIG. 31B. In FIG. 31C, an EDS micrograph of the silicon content is shown. A silicon-rich region in the Al substrate shows that alloying and hence electrical contact between the Al-ink and Al-substrate occurs to complete the solar cell anode.

Figure 6:
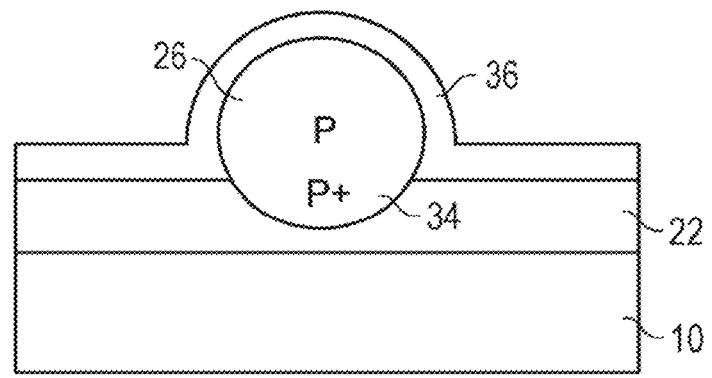
FIG. 6 illustrates a dielectric barrier layer coated over the surface of the PV panel.

In FIG. 6, a dielectric 36 is deposited over the surface of the PV panel, such as by spray coating or ink jet printing. In one embodiment, the dielectric 36 is a spray coated glass precursor, such as spin-on-glass (SOG), that is then cured. Spin-on-glass is a term used to describe a low viscosity glass that can be deposited by spin-coating or spray-coating. The thickness of the dielectric 36 is on the order of a few to a few tens of microns between the spheres since the spheres 26 only have a diameter between 10-300 microns. In another embodiment, the dielectric is a dispersion of polymer microbeads that, when cured, form a continuous insulating layer.

Figure 7:
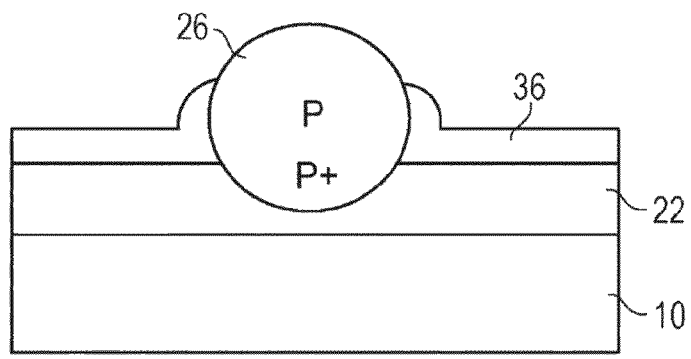
FIG. 7 illustrates the dielectric that has wetted off (or wicked off) the tops of the microspheres to expose the silicon surface.

In FIG. 7, the dielectric 36 is shown to wet off from the tops of the silicon spheres 26 to expose the upper silicon surface. Due to the low viscosity of the dielectric 36, the smooth surface of the silicon spheres, and the lack of chemical interaction between the silicon and the dielectric 36, the dielectric 36 pools along the edges of the silicon spheres 26 due to capillary action, surface tension, and gravity. This removal of the dielectric layer from the tops of the spheres may also be referred to as wicking. Even if there is a thin residual dielectric layer on the tops of the spheres 26, a subsequent laser diffusion step can overcome this thin dielectric layer to form a PN junction as described below. In another embodiment, the microbeads completely wet off the tops of the silicon microspheres exposing a pristine surface to form the PN junction.

Figure 8:
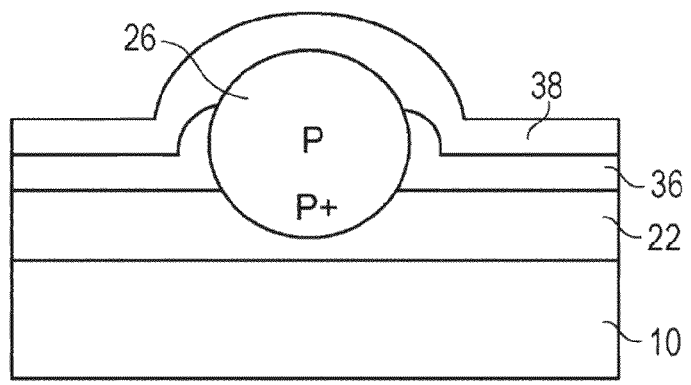
FIG. 8 illustrates an n-type dopant layer deposited over the silicon surface. n-type dopant atoms are diffused from the n-dopant layer into the silicon to create pn diodes in-situ.

In FIG. 8, an n-dopant layer 38 is deposited over the silicon surface to create pn junction diodes in-line. In one embodiment, the n-dopant layer 38 is a spray coated or printed phosphorus-doped glass layer. The dopants in layer 38 are diffused into the silicon using a pulsed laser. The laser heats the sphere surface 26 to, for instance, above the melting temperature of silicon to allow for rapid diffusion of the phosphorus into the silicon. In another embodiment, the dopant is phosphoric acid and can be coated directly over the dielectric layer, then diffused through the thin dielectric on top of the silicon microspheres using laser annealing to form p-n junctions. In a third embodiment, the dopant is phosphorus-doped nanosilicon or a phosphorus-containing silicon precursor which, upon irridation with the laser, forms a continuous silicon film. The film can either be amorphous, nanocrystalline, or monocrystalline depending on the laser conditions. When laser conditions are such to diffuse the phosphorus beyond the interface between the silicon film and the microsphere, a homojunction is formed. When the laser conditions are such to keep the phosphorus within the upper silicon layer, a heterojunction is formed. A 532 nm laser with a peak power of 45 W or less and fluences of 20-100 micro Joules, with a focal length up to 6 mm, is desirable.

Figure 9:
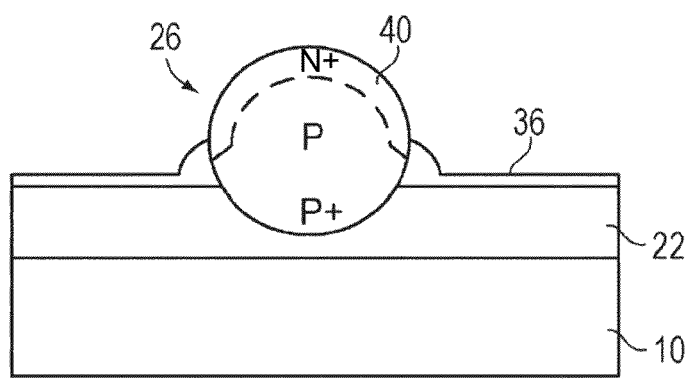
FIG. 9 illustrates the n-type dopant layer being washed off after doping the underlying silicon.

In FIG. 9, the remainder of the n-dopant layer 38 is washed or etched away, which may also further thin the dielectric layer 36. FIG. 9 illustrates the top portion of the silicon spheres 26 being an n-type portion 40, thus a pn diode is formed in-line using a roll-to-roll process. An additional dielectric layer may be deposited, if needed, that is designed to wet from most of the sphere surface so as to pool around the perimeter of the smooth spheres by gravity, surface tension, and capillary action.

Figure 10:
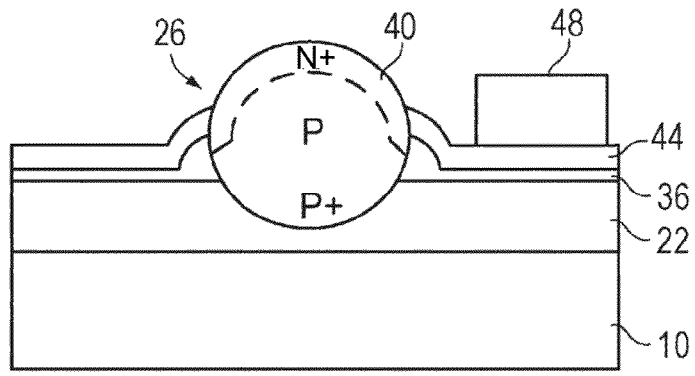
FIG. 10 illustrates a transparent conductor or other conductor coated at least along the edges of the silicon spheres, followed by printing a metal bus bar over a portion of the conductor. The transparent conductor material, if deposited as a liquid, may automatically retract from the top surfaces of the spheres by capillary action and desirably pool around the perimeter of the spheres to form a conducting network.

In FIG. 10, a transparent conductor or other conductor layer 44 is deposited at least along the edges of the silicon spheres 26 to electrically contact the $n^+$-type portion 40 of the spheres 26, and annealed to lower the contact resistance. In one embodiment, the conductor layer 44 is deposited by slot die coating, entailing forcing the liquid conductor material through a narrow slot onto the surface. In one embodiment, the transparent conductor material has a sufficiently low viscosity so as to pool around the perimeter of the smooth spheres by gravity, surface tension, and capillary action. The pooling of the transparent conductor lowers the resistance of the conductor and improves reliability. Since the transparent conductor substantially wicks off the tops of the diodes, any reflection problems with the transparent conductor are avoided, and any mismatch of index of refraction between the transparent conductor and the silicon becomes irrelevant. If desired, any thin conductor layer may be etched off the tops of the spheres using a wet etch.

If a non-transparent conductor layer is used, any conductor material over the top of the spheres 26 that significantly attenuates light in the solar radiation spectrum that can be absorbed by silicon should be etched away. In one embodiment, a layer comprising nanometer sized silver particles or wires in a binder is used as the conductor layer 44. The silver particles or wires contact each other after curing. In one embodiment, the conductor layer 44 is about 100-200 nm thick after drying.

A low resistivity metal bus bar 48 is then selectively printed over the transparent conductor layer 44, such as by inkjet printing or rotary screen printing of silver or other conductor. The resulting structure is then annealed to sinter the silver particles.

As previously mentioned, UV light from the sun absorbed by the silicon diodes generates wasted heat. The UV photons are absorbed in the upper highly doped emitter regions of the silicon spheres 26 because of their shallow absorption depth, so any UV-generated free carriers have a high probability of recombining.

Figure 11:
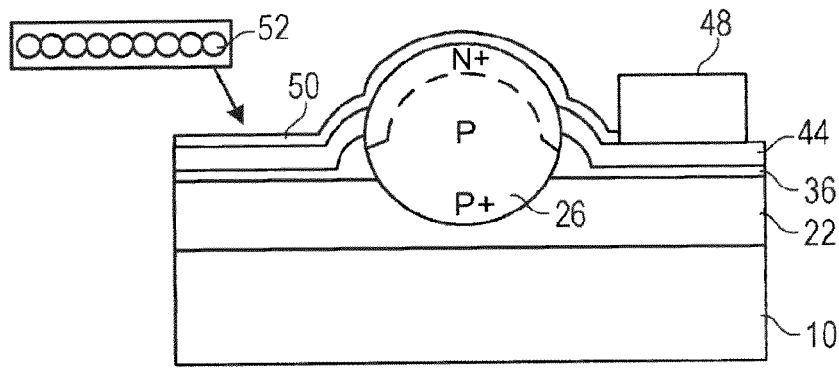
FIG. 11 illustrates the deposition of quantum dots on the silicon surface.

In FIG. 11, a layer 50 of nanosilicon quantum dots 52, having an average diameter between 2-20 nm, is deposited directly on the silicon surface, such as by spray coating or inkjet printing. Thus, the spheres 26 are conformally coated. Quantum dots of desired sizes are commercially available and are known to be used for converting blue or UV light from LEDs into longer wavelengths, which may create white light. The material and the size of the quantum dots determine the emitted wavelength. The quantum dots are dispersed over the spheres 26 (or over any transparent conductor) in a liquid, which is then evaporated to leave a thin layer 50 of the quantum dots 52 over the silicon spheres 26. The quantum dots 52 absorb the sun's UV light and emit visible light, such as red light at around 700 nm or less, due to photoluminescence. The visible light is then converted into current by the photovoltaic effect of the diodes. Thus, efficiency is increased and heat is reduced. Plots showing the sizes of the quantum dots vs. their photoluminescence energy are publicly available, and optimal sizes depend on the wavelengths in the solar spectrum and the wavelengths that are most efficiently converted to electricity by the silicon. The quantum dots 56 are not used to directly generate current.

Since the quantum dots 52 are preferably silicon, and the spheres 26 are silicon, the indices of refraction may be close in value so as not to increase the reflectivity of the silicon sphere surface. Further, the quantum dots 52 are applied after all electrical connections are made to the silicon spheres 26 so the quantum dot layer does not need to be conductive.

The quantum dot layer 50, possibly being non-conductive, may overlie the metal bus bar 48 since electrical contact to the metal bus bar 48 is made along the edges of the PV panel, where the quantum dots are not deposited. In one embodiment, the quantum dots 52 may be infused in a transparent conductor layer over the spheres 26.

Figure 12:
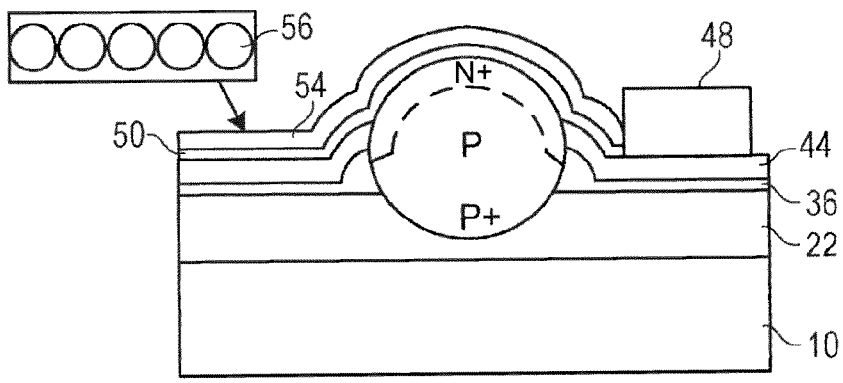
FIG. 12 illustrates the deposition of high-index nanoparticles (<300 nm) in a lower-index dielectric material, forming part of a graded (or stepped)-index lens for reducing reflection.
Figure 13:
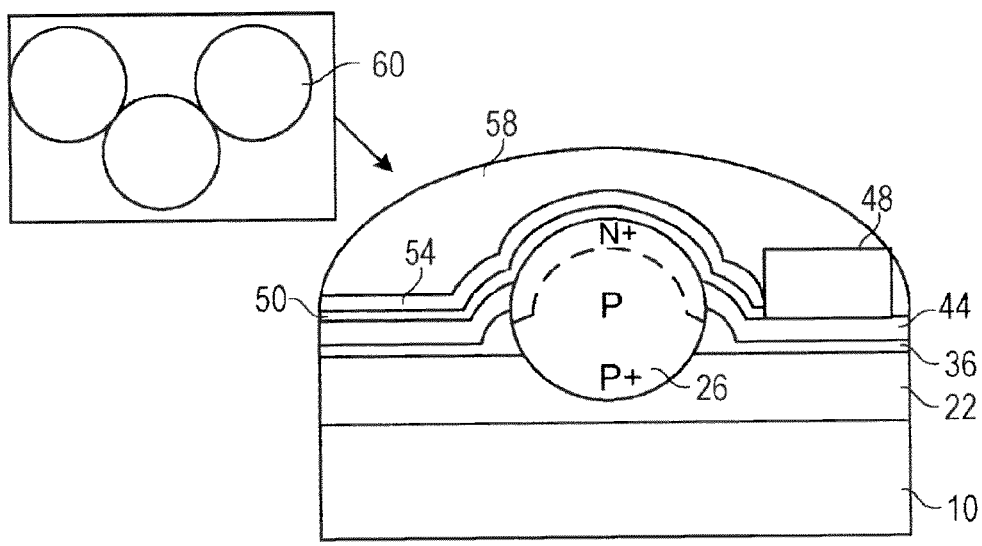
FIG. 13 illustrates the deposition of lower-index and larger particles forming part of the graded (or stepped)-index lens for reducing reflection.

Polished silicon reflects about 35-50% of visible light and 50-70% of ultraviolet light due to the large difference in the refractive indices (n) of air and silicon. FIGS. 12 and 13 illustrate the formation of a stepped-index lens, or graded-index lens, to reduce the reflectivity of the silicon. Only two lens layers are shown; however, additional layers can be added to grade the refractive index to further reduce reflective losses. Due to the rheology of the lens coating formulation, the bottom surface of the lens will inherently conform to the spheres 26, maximizing light transmission to the silicon spheres. In FIG. 12, a layer 54 containing high-index nanoparticles 56 in a binder is deposited over the quantum dot layer 50. In one embodiment, the nanoparticles 56 have an average diameter less than 300 nm, and preferably 10-100 nm. The shapes of the nanoparticles 56 will not necessarily be spherical, and the diameter is considered to be the widest diameter of the shape. The nanoparticles 56 are made of a material with a high index of refraction of about 1.7-2.4. This is generally higher than any high-index polymer. Since the nanoparticles 56 have a higher index than the binder they are infused in, it is critical to keep their size well below the wavelengths of interest (i.e., 350 nm and greater) or there would be significant absorption and reflection internal to the layer 54. Due to the small sizes of the nanoparticles 56, there is little or no reflection or absorption in the desired electromagnetic range. The binder may be polyvinylidene fluoride (PVDF) or another suitable polymer or other material that is a liquid when deposited. Nanoparticles may also be referred to as beads. In one embodiment, the nanoparticles 56 are transparent doped glass beads. The nanoparticles 56 and binder may be deposited by spray coating, printing, or using other atmospheric pressure deposition techniques. Upon curing, the thickness of the layer 54 may be a few microns. In another embodiment, the nanoparticles 56 are less than 10 microns if some absorption is tolerable.

In FIG. 13, a layer 58 containing lower-index and larger particles, preferably transparent glass beads 60 (e.g., silica), is deposited to form the upper part of the graded-index lens for reducing reflection. The glass beads 60 may have an index of between 1.4-1.43 to match the index of the liquid binder (e.g., PVDF). The beads 60 may have an average diameter between 1-10 microns. Since the beads 60 are formed to have about the same index as the binder, there is negligible absorption or reflection by the beads 60 in the binder. The glass beads 60, being much harder than the binder, desirably increase the abrasion resistance of the layer 58. If the glass beads 60 are densely packed, it will improve the moisture barrier characteristics of the layer. The layer 58 may be deposited by spray coating, printing, or other suitable atmospheric pressure process.

The thicknesses of the lens layers 54 and 58 in total may be less than 15 microns. In one embodiment, the layer 58 forms a generally hemispherical lens to additionally focus sunlight onto the silicon sphere. The graded or stepped indices of the lens provide a good transition from the high index silicon to the low index air. Additional layers of polymers and/or polymer-nanoparticle composites, having different indices, may be inserted between the layers 54 and 58 to create a finer graded lens to further reduce reflection. Polymers with indices less than 1.7 are commercially available.

The deposited lens 54, 58 are conformal with the silicon sphere since they are deposited as a viscous liquid. Hence the bottom surface of the lens 54 will conform to the sphere shape, and the bottom of the lens 58 will conform to the top of the lens 54 shape. Hence, both lenses 54, 58 may be made substantially hemispherical by the natural surface tension of the binder for maximum light acceptance. The term bead, as used herein, does not necessarily connote a spherical shape, although the glass beads used in the lens layers 54 and 58 preferably have rounded edges.

In another embodiment, a single conformal lens layer may contain a mixture of one or more nanoparticles of different refractive indices, and the concentration of nanoparticles may vary in concentration between the upper portion and the lower portion of the lens. In one embodiment, a single lens coating layer is preferred to simplify the number of coating steps during the roll-to-roll process. The size and/or mass of the nanoparticles for each refractive index may be different so that different sizes/masses of the nanoparticles settle to the bottom of the liquid layer at different rates, resulting in different layers of different indices nanoparticles being formed for a graded lens. The liquid may be heated to adjust its viscosity to enable the nanoparticles to settle. The optimal sizes may be determined by testing.

In another embodiment, the lens layers 54 and 58 are combined into a single graded-index layer containing the nanoparticles 56 infused in the lower index of refraction binder that formed part of the layer 58 in FIG. 13. The binder 58 however does not contain the glass beads 60. The nanoparticles 56 are mixed in the binder and deposited as described above in a single step. The nanoparticles 56 naturally migrate/settle to the bottom of the binder after deposition. The liquid layer may be heated to greatly lower its viscosity to control the settling of the nanoparticles 56. Thus, the lens area abutting the spheres 26 (having a high density of the nanoparticles 56) will have an index of refraction that is higher than the index of refraction further from the spheres 26 where there is a low density of the nanoparticles 56.

In another embodiment, multiple layers with different bulk refractive indexes are coated and cured on top of each other to more precisely grade the refractive index of the lens.

Figure 14:
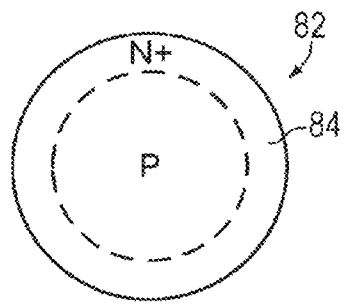
FIG. 14 illustrates another embodiment of the silicon sphere as a pre-formed diode.

FIG. 14 illustrates another embodiment of a silicon sphere 82 as a pre-formed diode created before it is applied to the substrate. The silicon spheres 82 may be p-doped. In one embodiment, the spheres are then subjected to $POCl_3$ in a batch barrel process to form an $n^+$-type shell 84 by diffusion of phosphorus into the silicon sphere surface. Other techniques such as a wet process with phosphoric acid may also be used.

Figure 15:
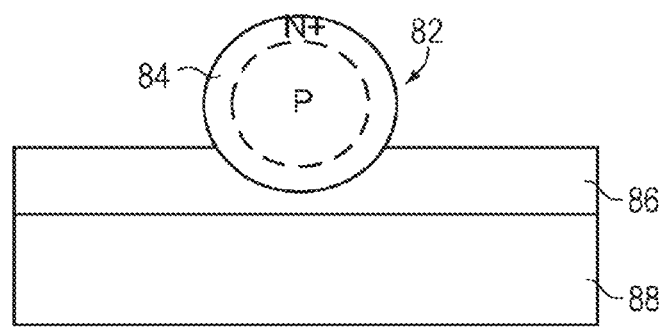
FIG. 15 illustrates the silicon diode of FIG. 14 embedded in a conductive layer such that electrical contact is made to the n+-type outer layer.

In FIG. 15, the silicon spheres 82 are embedded in a conductive layer 86 formed over a substrate 88, as previously described. The conductive layer 86 makes ohmic contact to the n-type shell 84.

Figure 16:
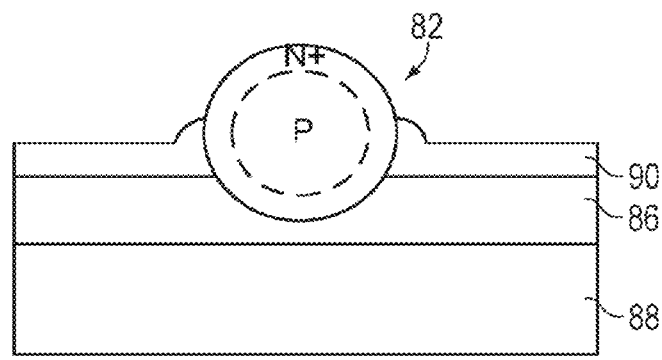
FIG. 16 illustrates a dielectric layer formed over the spheres and etched back to expose the tops of the spheres.

In FIG. 16, a dielectric layer 90 is formed over the conductive layer 86 and sides of the silicon spheres 82. The dielectric layer 90 may be inkjet-printed or spray coated spin-on glass (SOG) or polymer. The dielectric layer 90 is then cured. The dielectric layer 90 is then etched back to expose the top of the silicon spheres 82.

Figure 17:
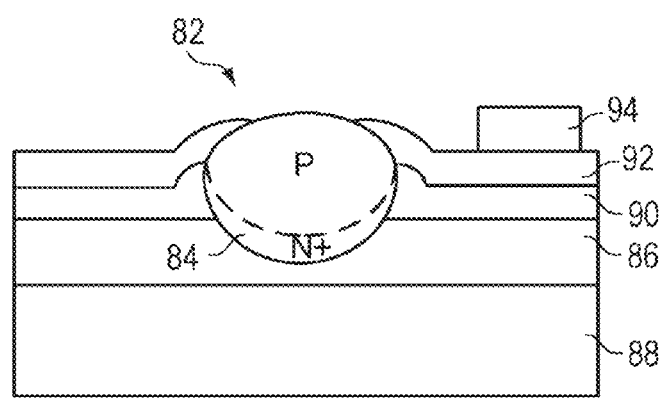
FIG. 17 illustrates that the tops of the spheres have been etched away to expose the p-type silicon. The exposed p-type silicon may have the initial p-type dopant concentration, or a doping step may be performed to make it p+-type. A transparent conductor is then formed to make ohmic contact with the p-type or p+-type silicon, followed by the formation of metal bus bars. The processes of FIGS. 11-13 may then be performed.

In FIG. 17, the top portion of the spheres 82 is etched using an atmospheric pressure chemical etching process, such as a wet or vapor etch, to expose the inner p-type portion of the spheres. If needed, the top of the spheres 82 may be additionally p-doped to form a $p^+$ type layer by depositing a p-doped layer over the spheres 82, heating the structure to diffuse the dopant into the tops of the spheres 82, then removing the remaining dopant layer. Heating may be done with a laser. This is similar to the process described with respect to FIG. 8 but using a p-doped layer.

A transparent conductor or other conductor layer 92 is then deposited over the structure so as to contact the p-type silicon. The conductor layer 92 may be an ink that is deposited by any type of printing, and then cured. The conductor 92 may be of a type that inherently pools around the perimeter of the spheres 82 by wicking off the top surface of the spheres 82 by gravity, surface tension, and capillary action, as previously described. Any transparent conductor 92 remaining over the spheres 82 may be acceptable, however. A non-transparent conductor may also be used. A metal bus bar 94 is then formed, such as by inkjet printing, over the transparent conductor layer 92 to reduce the resistance along the rows of spheres 82. Accordingly, electrical contact is made to the anodes and cathodes of all the spheres 82 deposited on the substrate 88, and the diodes are connected in parallel. The number of diodes connected in parallel, defined by the panel area, may be determined by the desired current to be generated by the panel.

The processes of FIGS. 11-13 may then be performed to deposit the quantum dot layer and the graded lens for improving the solar panel's power conversion efficiency. An entire panel of millions of diodes connected in parallel is thus completed, using all atmospheric pressure processes.

In a variation of FIGS. 14-17, the diodes may be deposited having: 1) an $n^+$-type outer shell and an intrinsic core (an i-conductivity type); 2) a p-type outer shell and an n-type or intrinsic core; 3) a $p^+$-type outer shell and an p-type or intrinsic core; or 4) an $n^+$-type outer shell and an n-type or intrinsic core prior. The outer shell or core may be doped after the diodes have been deposited.

FIGS. 18-25 illustrate another embodiment of the invention, using an all-atmospheric pressure printing process to form a PV panel.

Figure 18:
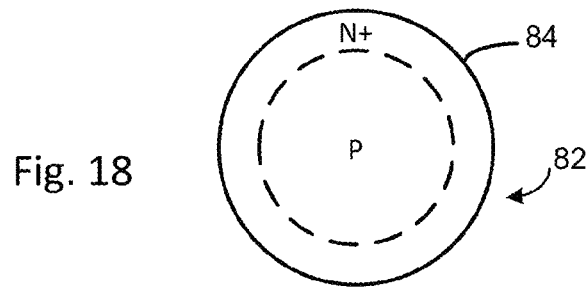
FIG. 18 illustrates the silicon sphere as a pre-formed diode.

FIG. 18 illustrates the silicon sphere 82 as a pre-formed diode, similar to that shown in FIG. 14. p-type doped silicon spheres are initially provided, and an outer $n^+$-type layer 84 is then formed on the spheres such as by subjecting the spheres to $POCl_3$ in a batch barrel process.

Figure 19:
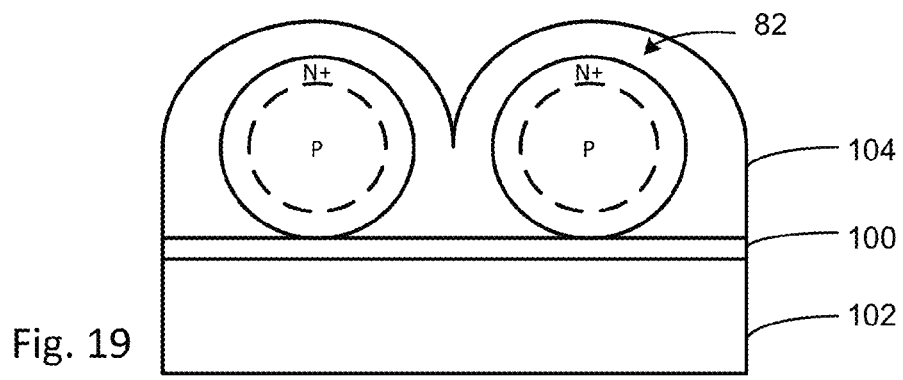
FIG. 19 illustrates the spheres deposited on a substrate and a dielectric deposited over the spheres.

As shown in FIG. 19, the spheres 82 are then printed on a dielectric layer 100, such as an adhesive tape, overlying a substrate 102. A dielectric 104, such as glass, is then deposited over the spheres 82. The dielectric 104 may be deposited by spray coating. A suitable glass may be spin-on-glass (SOG).

Figure 20:
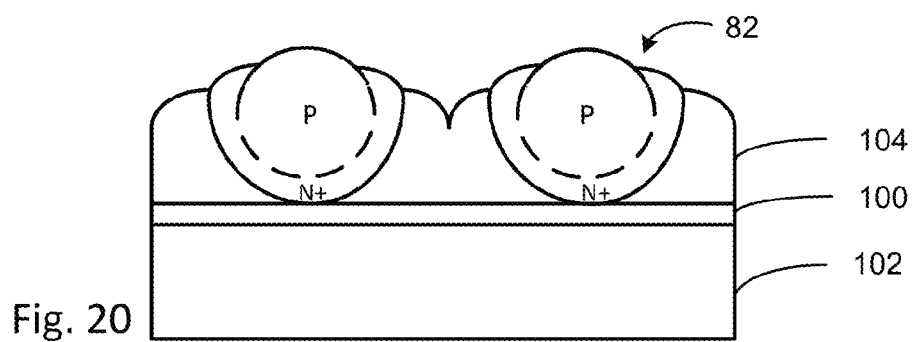
FIG. 20 illustrates the dielectric etched back to expose the tops of the spheres and the exposed n+-type silicon etched away to expose the underlying p-type silicon.

FIG. 20 illustrates the dielectric 104 etched back, such as with a wet etchant, to expose the tops of the spheres. The exposed n$^+$-type silicon is then etched away, such as with a wet or vapor chemical etchant, to expose the underlying p-type silicon. The dielectric 104, used as a sacrificial masking layer, is optional if anisotropic etching of the silicon is used. If the silicon etch is anisotropic, then the spheres 82 themselves block etching of the underside of the spheres 82.

Figure 21:
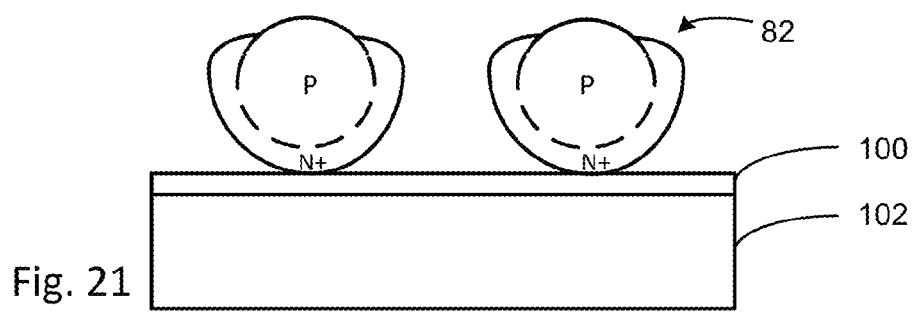
FIG. 21 illustrates the remaining dielectric being removed.

The remaining dielectric 104 is then removed, as shown in FIG. 21.

Figure 22:
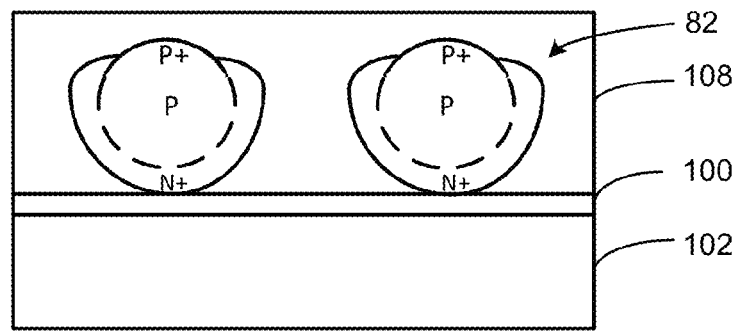
FIG. 22 illustrates an aluminum-containing layer being deposited and heated to form a p+-type region on top of each sphere.

FIG. 22 illustrates an aluminum-containing layer 108 screen printed over the spheres 82 as a paste. Other deposition techniques may also be used, such as slot die printing. The aluminum-containing layer 108 is then heated to flow the ink between the spheres 82 so that the aluminum makes ohmic contact with the n$^+$-type bottom layer of the spheres. The aluminum also dopes the top surface of the spheres 82 to make it a p$^+$-type. A rapid annealing system may be used to heat the surface of the aluminum-containing layer 108 to p-dope the top surface of the spheres 82.

If there is concern about diffusion between the adjacent p$^+$ and n$^+$ regions, a thin dielectric layer may be formed around each sphere 82 between the n$^+$-type region and the exposed p-type region, prior to depositing the aluminum-containing layer, to act as a separator after the p$^+$-type top surface of the spheres is formed.

Figure 23:
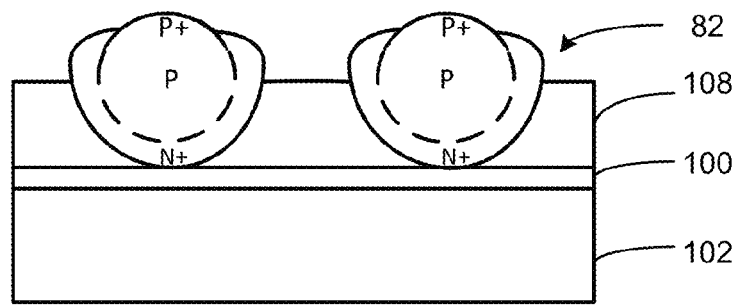
FIG. 23 illustrates the aluminum-containing layer being etched down to only ohmically contact the n+-type portion of the spheres.

In FIG. 23, any aluminum-containing layer remaining in contact with the top p$^+$-type silicon is removed by etching so that the aluminum-containing layer 108 only ohmically contacts the n$^+$-type portion of the spheres 82.

Figure 24:
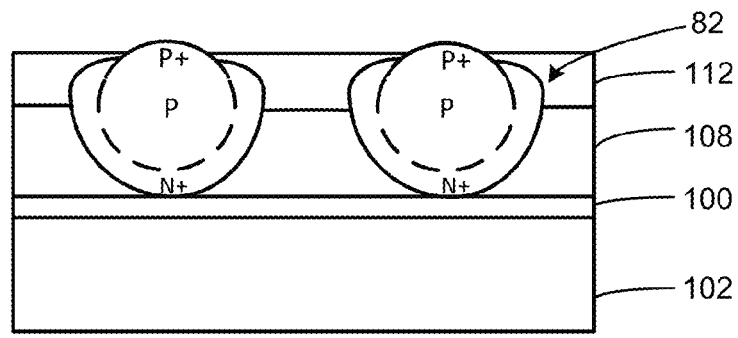
FIG. 24 illustrates a dielectric mask layer formed over the spheres to expose the p+-type regions.

In FIG. 24, a low temperature dielectric 112 is then printed over the sphere 82 and chemically etched to expose the p$^+$-type silicon.

Figure 25:
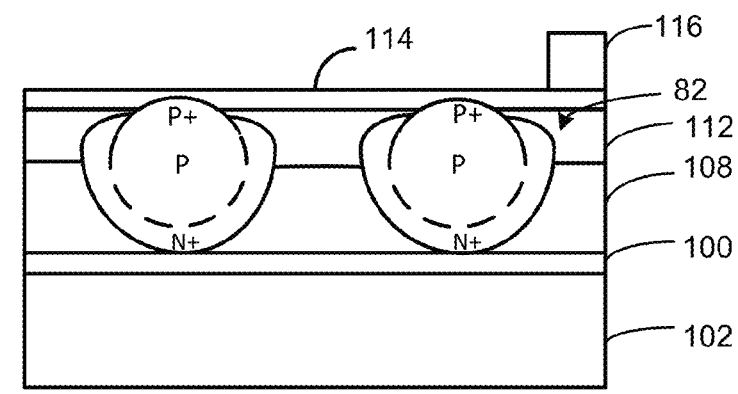
FIG. 25 illustrates a transparent conductor deposited over the spheres to contact the p+-type region and thicker metal bus bars contacting the transparent conductor.

In FIG. 25, a transparent conductor layer 114 is then deposited over the spheres 82 by slot die coating or other atmospheric pressure process. The conductor layer 114 is then cured to make ohmic contact with the p$^+$-type silicon. There may be desirable pooling of the transparent conductor material around the edges of the p$^+$-type silicon, and the transparent conductor may retract from the top surface.

Metal bus bars 116 are then printed to create a low resistance path to the p$^+$-type silicon via the transparent conductor layer 114.

A quantum dot layer and graded lens may then be formed, as previously described. If the top portion of the spheres 82 is exposed after the transparent conductor layer 114 is formed, the quantum dot and graded lens layers will conform to the sphere 82 surface.

Anode and cathode connectors are then formed leading to the aluminum-containing anode layer and the transparent conductor cathode layer.

The panels are then sheeted, mounted on a support structure, and electrically interconnected.

Additional variations contemplated by the inventors include the use of intrinsic silicon spheres or lightly n-doped silicon spheres as the base material. In either case, the p/n, p-i, or n-i junction or front surface field (n$^+$/n or p$^+$/i or n$^+$/i) can be introduced by a doped glass or other dopant source with laser-mediated diffusion of the dopant, as shown in FIGS. 8 and 9. The back surface field (p$^+$/i) or p/n or p-i junction may be introduced by p-type doping at the bottom of the spheres using an aluminum dopant from a conductive ink, as illustrated in FIG. 5.

Figure 26:
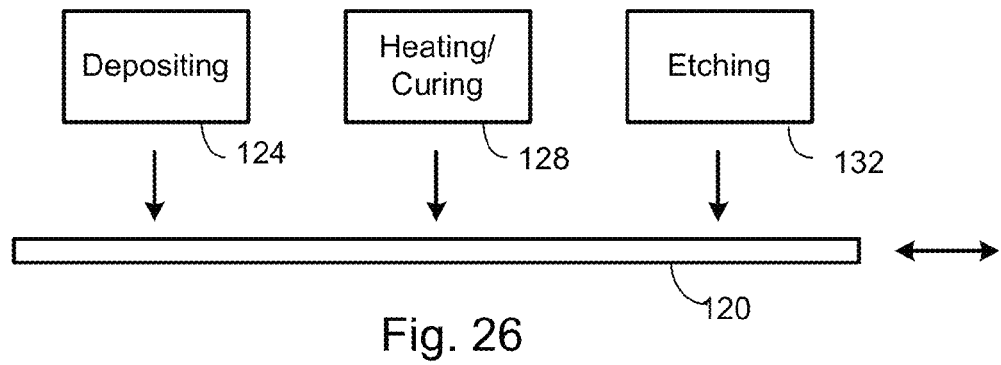
FIG. 26 is a schematic view of a portion of the all-atmospheric pressure printing process being performed using a roll-to-roll technique.

FIG. 26 is a schematic view of the all-atmospheric pressure printing process being performed using a roll-to-roll technique. A substrate 120, which may be on a roll or be a large sheet, is positioned under any suitable atmospheric pressure process station for performing any of the steps described above. The substrate 120 may continuously run through different stations for different processes (in-line roll-to-roll) and/or may be run under a particular set of tools at a single station for coverage of the entire substrate 120 before being moved to another station (roll-to-roll). The three basic equipment tool types used in the above processes are for depositing 124, heating/curing 128, and etching 132. The depositing 124 may be by slot die printing, inkjet printing, spray coating, screen printing, or other suitable technique. The heating/curing 128 may be performed by lasers, heat bars, IR, UV, blowers, or other suitable technique. The etching 132 may be performed by chemical vapor etching, wet etching, mechanical etching, or other suitable technique. Etchants for all the materials described herein may be conventional (e.g., fluorine-based, chlorine-based), used at atmospheric pressure.

Accordingly, at least the following features distinguish the inventive processes over the processes in US patent application publication no. 2010/0167441:

Embodiments of the present process form a conformal lens (FIGS. 12 and 13). Conformal lenses are more optimally shaped and are inherently optimally positioned over the diodes, so efficiency is improved. The index of refraction of the lenses is also stepped or graded to reduce the reflectivity of the silicon microspheres.

Embodiments of the present process form a quantum dot layer (FIG. 11) overlying the diodes, which conforms to the shape of the diodes, to improve efficiency and reduce heat.

Embodiments of the present process etch the diodes (FIGS. 17 and 20) to expose the core silicon region, followed by an optional p$^+$ or n$^+$ doping step. The exposed core is then contacted by a conductor.

Embodiments of the present process deposit an aluminum-containing layer 108 (FIG. 22) to p$^+$-dope the tops of the diodes, then the aluminum-containing layer 108 is etched down to only electrically contact the bottom n$^+$-type portion of the diodes.

The various near atmospheric pressure etch processes enable new process flows to be used to form the panels and, in some embodiments, improve the performance of the panels.

Embodiments of the process deposit a dielectric layer that wicks off the tops of the semiconductor spheres to substantially expose the tops of the spheres for doping, obviating the need for etching the dielectric. The dielectric insulates the anode and cathode conductors.

Embodiments of the present process deposit a transparent conductor that pools around the edges of the diodes, wicking off the top surface. This obviates the need for etching and improves optical efficiency.

Embodiments of the present process use a substrate without channels and deposit the silicon spheres over an uncured or partially cured Al layer (FIG. 3). Annealing the Al layer allows the Al to p$^+$ dope the silicon. The resulting Al layer has a very low electrical resistance, and the Al layer is impervious to the sustained UV exposure from the sun.

Embodiments of the present process n-dope the top portions of the silicon with a layer of phosphorus containing material (FIG. 8), then etch the remaining material residue away (FIG. 9). Etching the material residue away improves the optical efficiency and lowers the resistance of the silicon-transparent conductor contact.

Other improvements over the prior art also exist.

Figure 27:
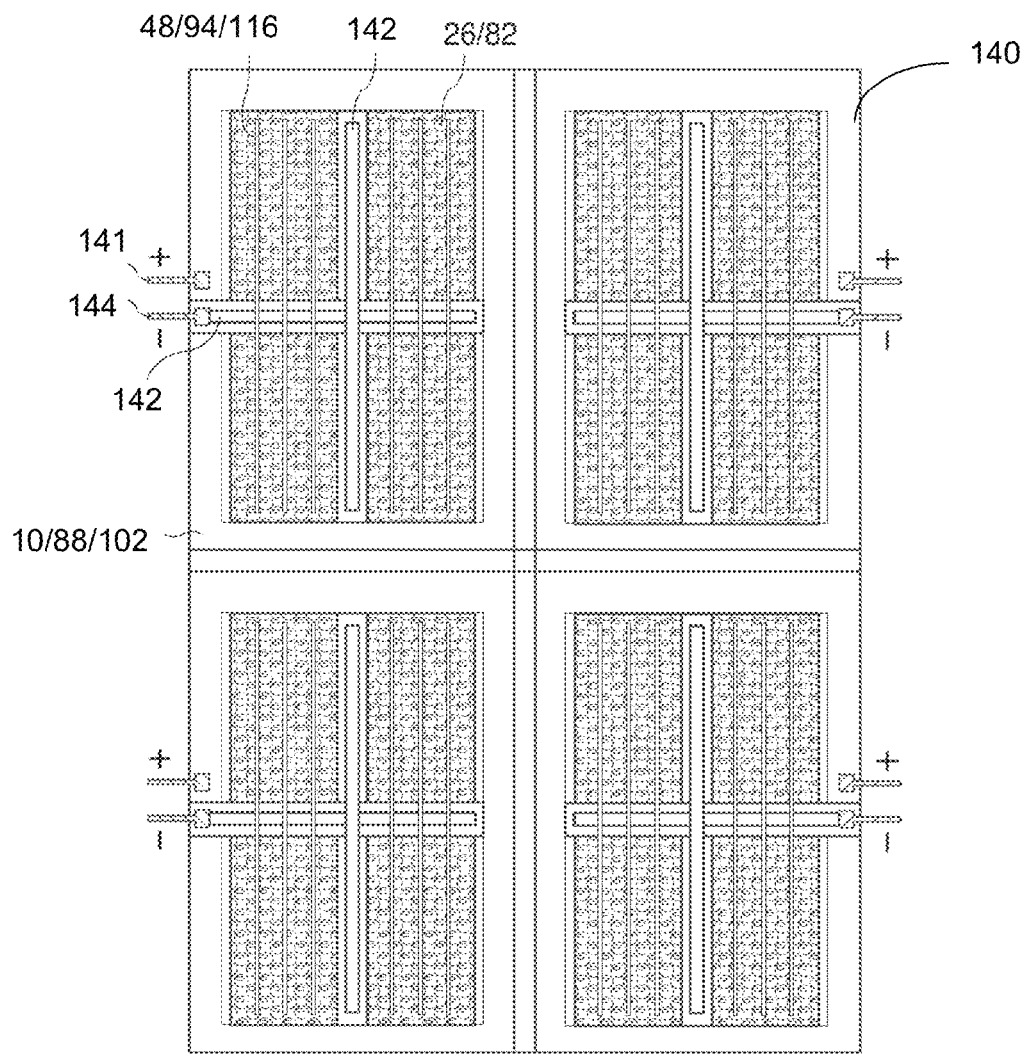
FIG. 27 is a top down view of four PV panels, each typically containing millions of silicon diodes connected in parallel for converting sunlight into electrical power, where robust metal bus bars are formed to electrically contact the narrower printed conductors, and where electrodes are formed to allow the panels to be connected in series by external conductors.

FIG. 27 is a top down view of four panels 140, each made by any of the above-described processes and each containing millions of silicon diodes connected in parallel for converting sunlight into electrical power. The metal substrates 10/88/102 are shown to have a first electrical connection 141 made to it (e.g., an anode electrode). The metal bus bars 48/94/116 are all connected together with much larger and lower resistance metal bus bars 142, which may be formed in the x and y directions. The number of the bus bars 142 depends on the size of the panel and the number of diodes connected in parallel. A second electrical connection 144 (e.g., a cathode electrode) is made to the metal bus bars 142.

The various panels 140 are then connected in any combination of series and parallel by external conductors, such as wires or part of a frame, to achieve the desired voltage and current.

Each panel 140 may also be referred to as a solar cell, since each cell acts as a single unit that is then interconnected with other cells, as desired by the user. The solar cells may take any form and not necessarily be rectangular panels.

In one embodiment, sunlight is converted to electricity by the panels 140, and a DC-DC converter converts the electricity to a suitable voltage to charge a battery.

Although the diodes are described as being spheres, the diodes may be generally spherical and still be referred to as spheres. The exact shape depends on tolerances in the processes and a certain degree of randomness. The term "semiconductor particles" is used herein to refer to the diodes having any shape, including spheres, polyhedrons, or random shapes.

The various transparent layers and the transparent glass beads forming the lens need not be 100% transparent at all relevant wavelengths, given the limitations of the materials, but are still referred to as transparent in accordance with the common usage in the art.

All steps described herein are performed on at least a panel-level in atmospheric pressure conditions, obviating the need for any vacuum chambers, allowing the panels to be formed quickly and inexpensively in a roll-to-roll process. The completed panel is light weight and flexible.

The techniques described herein may also be used to form panels of light emitting diodes. Instead of silicon spheres, the semiconductor particles may be GaN-based particles (e.g., spheres) that generate blue light. A layer of phosphor may be deposited over the semiconducting particles by spray coating or printing to create white light or any other wavelengths of light. All other processes described herein, suitable for LEDs, may be the same to make electrical contact to the anodes and cathodes of the LEDs, or to dope the LEDs, or to form lenses over the LEDs.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

In addition to the presently claimed invention, various other inventions, assigned to the present assignee, are listed below along with their inventors.

QUANTUM DOTS BETWEEN DIODES AND LENS IN A PV PANEL. FIG. 11. Lixin Zheng, Tricia A. Youngbull 1. A solar cell structure comprising:
 a plurality of silicon diodes on a substrate adapted to convert sunlight to electricity, the diodes having a first surface portion for being exposed to the sun; and
 a quantum dot layer deposited at least over the first surface portion to conform to the first surface portion, the quantum dot layer converting the sunlight's UV wavelengths to emitted visible wavelengths, wherein the one or more diodes convert the emitted visible wavelengths to electricity.

2. The structure of Claim 1 wherein the diodes comprises a plurality of silicon spheres on a substrate, the diodes having a top surface of a first conductivity type connected to a first conductor and a bottom surface of a second conductivity type connected to a second conductor, the quantum dots being deposited over the top surface of the diodes and on at least a portion of the first conductor.

3. The structure of Claim 1 wherein the quantum dot layer comprises a layer of nanosilicon particles having an average diameter between 2-20 nm.

4. The structure of Claim 1 wherein the quantum dot layer comprises a layer of nanoparticles having an average diameter between 2-20 nm.

5. The structure of Claim 1 wherein the quantum dots emit light having a wavelength of less than 1000 nm.

6. The structure of Claim 1 wherein the one or more diodes comprises a plurality of silicon spheres on a substrate, the diodes having an average diameter greater than 10 microns, the diodes having a top surface of a first conductivity type and a bottom surface of a second conductivity type, the quantum dots being deposited over the top surface of the diodes, wherein the quantum dots have an average diameter less than 20 nm and convert UV light from the sun into light having a wavelength of less than 1000 nm.

7. The structure of Claim 6 further comprising a lens formed over the quantum dot layer.

8. The structure of Claim 7 wherein the lens has a graded index of refraction.

9. The structure of Claim 8 wherein the diodes have an outer surface formed of a first material having a first index of refraction, the lens comprising:
 a first lens layer overlying the first surface portion, the first lens layer comprising transparent first particles having an average first diameter less than 300 nm, the first particles having a second index of refraction less than the first index of refraction; and
 a second lens layer overlying the first lens layer, the second lens layer comprising transparent second particles having an average second diameter greater than the first diameter, the second particles having a third index of refraction less than the second index of refraction.

10. The structure of Claim 1 wherein the diodes are electrically contacted by conductors, and wherein the quantum dot layer is blanket deposited over the diodes and over the conductors.

11. A method of forming a solar cell structure comprising:
 depositing a plurality of silicon diodes on a substrate adapted to convert sunlight to electricity, the diodes having a first surface portion for being exposed to the sun; and
 depositing a quantum dot layer at least over the first surface portion to conform to the first surface portion, the quantum dot layer converting the sunlight's UV wavelengths to emitted visible wavelengths, wherein the one or more diodes convert the emitted visible wavelengths to electricity.

12. The method of Claim 11 wherein the diodes have an average diameter greater than 10 microns, and wherein the quantum dot layer comprises a layer of nanosilicon particles having an average diameter less than 20 nm so as to convert UV light from to sun to visible light having a wavelength less than 1000 nm.

13. The method of Claim 11 further comprising forming a lens over the quantum dot layer.

14. The method of Claim 13 wherein the lens has a graded index of refraction.

15. The method of Claim 14 wherein the diodes have an outer surface formed of a first material having a first index of refraction, and wherein forming the lens comprises:
depositing a first lens layer overlying the first surface portion, the first lens layer comprising transparent first particles having an average first diameter less than 300 nm, the first particles having a second index of refraction less than the first index of refraction; and
depositing a second lens layer overlying the first lens layer, the second lens layer comprising transparent second particles having an average second diameter larger than the first diameter, the second particles having a third index of refraction less than the second index of refraction.

CONFORMAL LENS OVER SPHERICAL DIODES IN A PV PANEL. FIGS. 12 and 13. Tricia A. Youngbull, Lixin Zheng, Vera N. Lockett.

1. A process for forming a solar cell structure comprising:
providing a plurality of diodes on a substrate adapted to convert sunlight to electricity, the diodes having a rounded top surface portion of a first conductivity type for being exposed to the sun and having a bottom surface portion of a second conductivity type;
providing a first conductor electrically contacting the bottom surface portion;
depositing a second conductor electrically contacting the top surface portion; and
depositing a lens material over the top surface portion, wherein, only after the lens material is deposited, a bottom surface of the lens material substantially conforms to the rounded shape of the top surface portion.

2. The process of Claim 1 wherein the step of depositing the lens material comprises:
depositing a liquid lens material over the diodes, wherein the liquid lens material substantially conforms to the top surface portion of the diodes by at least surface tension; and
curing the liquid lens material to form a first lens.

3. The process of Claim 2 wherein the diodes have an average diameter less than 300 microns, wherein the first conductor comprises a metal layer, and wherein the second conductor comprises a transparent conductor layer, the process further comprising:
depositing a dielectric layer over the metal layer, the dielectric layer extending between the diodes; and
depositing the transparent conductor layer over the dielectric layer to electrically contact the top surface portion of the diodes and electrically interconnect the diodes,
wherein the step of depositing the liquid lens material comprises depositing the liquid lens material over the dielectric layer between the diodes and over the transparent conductor layer between the diodes as well as over the top surface portion of the diodes.

4. The process of Claim 3 further comprising depositing a quantum dot layer over the dielectric layer, over the transparent conductor layer, and over the diodes prior to depositing the liquid lens material.

5. The process of Claim 2 wherein the liquid lens material is deposited by one of coating or printing.

6. The process of Claim 2 wherein the liquid lens material is deposited over the plurality of diodes and between the diodes without masking the diodes.

7. The process of Claim 2 wherein the first lens has a first index of refraction, the process further comprising:
depositing a second liquid lens material over the first lens, a bottom surface of the second liquid lens material conforming to a top surface of the first lens; and
curing the second liquid material to form a second lens, the second lens having a second index of refraction lower than the first index of refraction.

8. The process of Claim 2 wherein the liquid lens material comprises first particles transparent to visible light and having an average diameter less than 10 microns, where the first particles are in a first liquid binder which, when cured, has a first index of refraction, the first particles having a second index of refraction higher than the first index of refraction.

9. The process of Claim 8 wherein the first particles have an average diameter less than 300 nm 10. The process of Claim 8 further comprising:
depositing a second liquid lens material over the first lens, a bottom surface of the second liquid lens material conforming to a top surface of the first lens; and
curing the second liquid material to form a second lens, the second lens having a third index of refraction lower than the second index of refraction.

11. The process of Claim 10 wherein the second liquid lens material comprises second particles transparent to visible light in a second liquid binder.

12. The process of Claim 11 wherein the second particles have approximately the third index of refraction, and the second liquid binder, when cured, also has approximately the third index of refraction.

13. The process of Claim 8 wherein the first particles comprise glass beads.

14. A solar cell structure comprising:
a plurality of diodes on a substrate adapted to convert sunlight to electricity, the diodes having a rounded top surface portion of a first conductivity type for being exposed to the sun and having a bottom surface portion of a second conductivity type;
a first conductor electrically contacting the bottom surface portion;
a second conductor electrically contacting the top surface portion; and
a first lens, formed of a first lens material deposited over the top surface portion as a liquid, then cured, such that a bottom surface of the first lens has substantially conformed around the rounded shape of the top surface portion.

15. The structure of Claim 14 wherein the diodes have a substantially spherical shape, wherein the first lens material substantially conforms to the top surface portion of the diodes by at least surface tension.

16. The structure of Claim 14 wherein the diodes have an average diameter less than 300 microns, wherein the first conductor comprises a metal layer, and wherein the second conductor comprises a transparent conductor layer, the panel further comprising:
a dielectric layer over the metal layer, the dielectric layer extending between the diodes; and
the transparent conductor layer being over the dielectric layer to electrically contact the top surface portion of the diodes and electrically interconnect the diodes, wherein the first lens material overlies the dielectric layer between the diodes and over the transparent conductor layer between the diodes as well as over the top surface portion of the diodes.

17. The structure of Claim 16 further comprising a quantum dot layer over the dielectric layer, over the transparent conductor layer, and over the diodes, the first lens being formed over the quantum dot layer.

18. The structure of Claim 14 wherein the first lens has a first index of refraction, the panel further comprising:
a second lens formed over the first lens, the second lens formed of a second lens material deposited over the first lens, then cured, a bottom surface of the second lens conforming to a top surface of the first lens, the second lens having a second index of refraction lower than the first index of refraction.

19. The structure of Claim 14 wherein the first lens comprises first particles transparent to visible light, the first particles having an average diameter less than 10 microns, where the first transparent particles are in a first binder having a first index of refraction, the first transparent particles having a second index of refraction higher than the first index of refraction.

20. The structure of Claim 19 wherein the first particles have an average diameter less than 300 nm.

21. The structure of Claim 19 further comprising:
a second lens formed over the first lens, the second lens formed of a second lens material deposited over the first lens, then cured, a bottom surface of the second lens conforming to a top surface of the first lens, the second lens having a third index of refraction lower than the second index of refraction.

22. The structure of Claim 21 wherein the second lens comprises second particles transparent to visible light in a second binder, wherein the second particles have approximately the third index of refraction, and the second binder also has approximately the third index of refraction.

DIELECTRIC WETTING OFF TOPS OF SILICON MICROSPHERES IN PV PANEL TO INSULATE ANODE AND CATHODE CONDUCTORS. FIGS. 6 and 7. Mark M. Lowenthal, Tricia A. Youngbull, Lixin Zheng.

1. A process for forming a solar cell structure comprising:
depositing a plurality of semiconductor particles on a substrate at atmospheric pressure, the particles having a top surface portion for being exposed to the sun to generate electricity and having a bottom surface portion;
providing a first conductor electrically contacting the bottom surface portion, the bottom surface portion having a first conductivity type;
depositing a dielectric layer over the first conductor and over the top surface portion of the particles;
wicking substantially all of the dielectric layer off the top surface portion by capillary action so as to pool along the edges of the particles;
depositing a first layer of material over the top surface portion at atmospheric pressure, the first layer of material containing dopants of a second conductivity type;
heating the first layer of material to dope the top surface portion with the dopants of the second conductivity type;
removing the first layer of material at atmospheric pressure; and
depositing a second conductor over the dielectric layer electrically contacting the top surface portion.

2. The process of Claim 1 wherein the step of heating the first layer of material to dope the top surface portion with the dopants of the second conductivity type comprises heating the first layer of material using a laser.

ETCHING SILICON DIODES IN PV PANEL TO EXPOSE THEIR INNER CORE FOR CONDUCTOR CONTACT. FIGS. 17-20. Tricia A. Youngbull, Theodore I. Kamins.

1. A process for forming a solar cell structure comprising:
depositing a plurality of diodes on a substrate adapted to convert sunlight to electricity, the diodes having a top surface portion for being exposed to the sun and having a bottom surface portion,
wherein, prior to depositing the plurality of diodes, the diodes have a core portion having a first conductivity type and an outer shell having another conductivity type;
etching the top surface portion of the diodes to remove a portion of the outer shell to expose the core portion;
providing a first conductor electrically contacting the outer shell at the bottom surface portion;
depositing a dielectric layer over the first conductor at least around the diodes; and
depositing a second conductor electrically contacting the exposed core portion.

2. The process of Claim 1 wherein the diodes have an average diameter less than 300 microns.

3. The process of Claim 1 wherein the diodes have an $n^+$-type outer shell and a p-type or intrinsic core prior to being deposited on the substrate.

4. The process of Claim 1 wherein the diodes have a p-type outer shell and an n-type or intrinsic core prior to being deposited on the substrate.

5. The process of Claim 1 wherein the diodes have a $p^+$-type outer shell and a p-type or intrinsic core prior to being deposited on the substrate.

6. The process of Claim 1 wherein the diodes have an $n^+$-type outer shell and an n-type or intrinsic core prior to being deposited on the substrate.

7. The process of Claim 1 further comprising doping the outer shell or the core after the diodes have been deposited.

8. The process of Claim 1 wherein the first conductor is a metal layer formed on the substrate prior to depositing the plurality of diodes, and the bottom surface portion of the diodes electrically contacts the metal layer.

9. The process of Claim 1 wherein the first conductor is a metal layer formed on the substrate after depositing the plurality of diodes.

10. The process of Claim 1 wherein the second conductor is a transparent conductor layer deposited over the exposed core portion.

11. The process of Claim 1 wherein the diodes are deposited by printing.

12. The process of Claim 1 wherein the steps of etching the top surface portion, providing the first conductor, depositing the dielectric layer, and depositing the second conductor are performed without masking the diodes and performed at atmospheric pressure.

13. The process of Claim 1 wherein the diodes are substantially spherical and have an average diameter less than 300 microns.

14. The process of Claim 1 wherein the substrate comprises a metal layer which is the first conductor.

15. The process of Claim 1 wherein the diodes have an $n^+$-type outer shell and a p-type core prior to being deposited on the substrate, the process further comprising:
after etching the top surface portion of the diodes to expose the core portion, depositing an aluminum-containing layer over the diodes;

heating the aluminum-containing layer to further p⁺-dope the exposed core portion; and etching the aluminum-containing layer to expose the top surface portion of the diodes to form the first conductor.

16. The process of Claim 1 further comprising depositing a liquid lens material over the top surface portion of the diodes and curing the lens material to form a lens having a bottom surface that conforms to the top surface portion of the diodes.

17. A solar cell structure comprising:
a plurality of diodes on a substrate adapted to convert sunlight to electricity, the diodes having a top surface portion for being exposed to the sun and having a bottom surface portion, the diodes having a core portion having a first conductivity type and an outer shell having another conductivity type;
the top surface portion of the diodes being etched away to remove a portion of the outer shell to expose the core portion;
a first conductor layer electrically contacting the outer shell at the bottom surface portion;
a dielectric layer over the first conductor at least around the diodes; and
a second conductor layer over the dielectric layer electrically contacting the exposed core portion.

18. The structure of Claim 17 wherein the diodes have an average diameter less than 300 microns.

19. The structure of Claim 17 wherein the diodes have an n⁺-type outer shell and a p-type core.

20. The structure of Claim 17 wherein the diodes have a p-type outer shell and an n-type or intrinsic core.

21. The structure of Claim 17 wherein the diodes have a p⁺-type outer shell and a p-type or intrinsic core.

22. The structure of Claim 17 wherein the diodes have an n⁺-type outer shell and an n-type or intrinsic core. 23. The structure of Claim 17 wherein the first conductor is a metal layer formed on the substrate and the diodes are partially embedded in the metal layer.

24. The structure of Claim 17 wherein the second conductor layer is a transparent conductor layer deposited over the exposed core portion.

25. The structure of Claim 17 further comprising a lens over the top surface portion of the diodes, the lens being deposited as a liquid and cured, causing the lens to have a bottom surface that conforms to the top surface portion of the diodes.

DEPOSITING SEMICONDUCTOR SPHERES IN AN UNCURED ALUMINUM-CONTAINING LAYER TO FORM A SUBSTANTIALLY CLOSED PACKED MONOLAYER OF SPHERES. FIGS. 3-10. Mark M. Lowenthal, Edward W. Kahrs, Vera N. Lockett, William J. Ray, Howard Nelson, Tricia A. Youngbull.

1. A process for forming a solar cell structure comprising:
providing a substantially flat substrate;
depositing an aluminum-containing layer over the substrate, the aluminum-containing layer being uncured;
depositing a plurality of semiconductor particles on the uncured aluminum-containing layer so that the particles are partially embedded in the aluminum-containing layer, the particles having a top surface portion for being exposed to the sun to generate electricity and having a bottom surface portion;
heating the aluminum-containing layer to at least partially sinter the aluminum-containing layer, the bottom surface portion being of a first conductivity type, wherein the aluminum-containing layer is a conductor electrically contacting the bottom surface portion, wherein the semiconductor particles form a monolayer over the aluminum-containing layer;
depositing a dielectric layer over exposed portions of the aluminum-containing layer; and
depositing a conductor over the dielectric layer electrically contacting the top surface portion, the top surface portion being of second conductivity type, wherein, at least after the step of depositing the conductor over the dielectric layer, the semiconductor particles are a plurality of diodes adapted to convert sunlight to electricity.

2. The process of Claim 1 wherein the plurality of semiconductor particles are assembled in the monolayer over the uncured aluminum-containing layer using a coating process.

3. The process of Claim 1 further comprising doping the top surface portion of the semiconductor particles in-situ to form diodes.

4. The process of Claim 3 wherein the top surface portion is doped with n-type dopants.

5. The process of Claim 1 wherein the semiconductor particles are p-type when initially deposited on the uncured aluminum-containing layer.

6. The process of Claim 5 further comprising depositing a phosphorus layer over the top surface portion and heating the phosphorus layer to diffuse n-type dopants into the top surface portion.

7. The process of Claim 6 further comprising removing the phosphorus layer prior to depositing the conductor over the dielectric layer.

8. The process of Claim 1 wherein heating the aluminum-containing layer diffuses p-type dopants into the bottom surface portion of the semiconductor particles.

9. The process of Claim 1 wherein the semiconductor particles are diodes having a core portion being the first conductivity type and an outer shell being the second conductivity type.

10. The process of Claim 9 further comprising etching away a top surface of the semiconductor particles to expose the core portion prior to depositing the conductor, wherein the conductor contacts the core portion.

11. The process of Claim 1 wherein the semiconductor particles are diodes having a core portion being the second conductivity type and an outer shell being the first conductivity type.

12. The process of Claim 11 further comprising etching away a top surface of the semiconductor particles to expose the core portion prior to depositing the conductor, wherein the conductor contacts the core portion.

13. The process of Claim 1 wherein the conductor is a transparent conductor.

14. The process of Claim 1 wherein the semiconductor particles are substantially spherical and have an average diameter less than 300 microns.

15. The process of Claim 1 wherein the substrate is a dielectric.

16. The process of Claim 1 wherein the substrate is electrically conductive.

17. A solar cell structure comprising:
a substantially flat substrate;
an aluminum-containing layer over the substrate, the aluminum-containing layer being uncured when deposited;
a plurality of semiconductor particles partially embedded in the uncured aluminum-containing layer, the particles having a top surface portion for being exposed to the sun to generate electricity and having a bottom surface portion, the aluminum-containing layer being heated to at least partially sinter the aluminum-containing layer, the bottom surface portion being of a first conductivity type, wherein the aluminum-containing layer is a conductor electrically contacting the bottom surface portion;

a dielectric layer over exposed portions of the aluminum-containing layer; and a conductor over the dielectric layer electrically contacting the top surface portion, the top surface portion being of second conductivity type, wherein, the semiconductor particles are a plurality of diodes adapted to convert sunlight to electricity.

18. The structure of Claim 17 wherein the plurality of semiconductor particles are assembled in a monolayer over the aluminum-containing layer.

19. The structure of Claim 17 wherein the top surface portion is doped with n-type dopants and the bottom surface portion is p-type.

20. The structure of Claim 17 wherein the semiconductor particles are diodes having a core portion being the second conductivity type and an outer shell being the first conductivity type.

21. The structure of Claim 17 wherein the semiconductor particles are substantially spherical and have an average diameter less than 300 microns.

22. The structure of Claim 17 wherein the substrate is a dielectric.

23. The structure of Claim 17 wherein the substrate is electrically conductive.

LOW TEMPERATURE BACK SURFACE FIELD FORMATION IN SILICON MICROSPHERES IN A PV PANEL. FIGS. 3-6. Tricia A. Youngbull, Theodore I. Kamins, Vera N. Lockett, Matthew Gess.

1. A process for forming a solar cell structure comprising:
providing a substantially flat substrate;
depositing an aluminum-containing layer over the substrate, the aluminum-containing layer being uncured;
depositing a plurality of semiconductor particles on the uncured aluminum-containing layer so that the particles are partially embedded in the aluminum-containing layer, the particles having a top surface portion for being exposed to the sun to generate electricity and having a bottom surface portion;
heating the aluminum-containing layer to diffuse p-type dopants into the bottom surface portion to create a back surface field, wherein the aluminum-containing layer is a conductor electrically contacting the bottom surface portion, wherein the semiconductor particles form a monolayer over the aluminum-containing layer;
depositing a dielectric layer over exposed portions of the aluminum-containing layer; and
depositing a conductor over the dielectric layer electrically contacting the top surface portion, the top surface portion being of second conductivity type, wherein, at least after the step of depositing the conductor over the dielectric layer, the semiconductor particles are a plurality of diodes adapted to convert sunlight to electricity.

DEPOSIT DOPING LAYER OVER SEMICONDUCTOR SPHERES IN A PV PANEL AND DIFFUSING DOPANTS USING LASER ANNEALING. FIGS. 8-10. Tricia A. Youngbull, Richard A. Blanchard, Theodore I. Kamins, William J. Ray.

1. A process for forming a solar cell structure comprising:
depositing a plurality of semiconductor particles on a substrate at atmospheric pressure, the particles having a top surface portion for being exposed to the sun to generate electricity and having a bottom surface portion;
providing a first conductor electrically contacting the bottom surface portion, the bottom surface portion having a first conductivity type;
depositing a dielectric layer over the first conductor;
depositing a first layer of material over the top surface portion at atmospheric pressure, the first layer of material containing dopants of a second conductivity type;
heating the first layer of material to dope the top surface portion with the dopants of the second conductivity type;
removing the first layer of material at atmospheric pressure; and
depositing a second conductor over the dielectric layer electrically contacting the top surface portion.

2. The process of Claim 1 wherein the first layer of material comprises phosphorus, and the dopants of the second conductivity type are n-type dopants.

3. The process of Claim 1 wherein the first conductor is a metal layer.

4. The process of Claim 1 wherein the step of providing the first conductor comprises depositing an aluminum-containing layer over the substrate, the aluminum-containing layer being uncured, and wherein the step of depositing the plurality of semiconductor particles comprises:
depositing the plurality of semiconductor particles on the uncured aluminum-containing layer so that the particles are partially embedded in the aluminum-containing layer; and
heating the aluminum-containing layer to at least partially sinter the aluminum-containing layer and dope the bottom surface portion with p-type dopants.

5. The process of Claim 1 wherein the first conductor is a metal layer, and the plurality of semiconductor particles are assembled in a monolayer over the metal layer using a printing process.

6. The process of Claim 1 wherein the semiconductor particles are p-type when initially deposited on the substrate, wherein the step of heating the first layer of material dopes the top surface portion with n-type dopants to convert the semiconductor particles to diodes.

7. The process of Claim 1 wherein the second conductor is a transparent conductor.

8. The process of Claim 1 wherein the semiconductor particles have an average diameter less than 300 microns.

9. The process of Claim 1 wherein the substrate is a dielectric and the first conductor is a metal layer over the substrate.

10. The process of Claim 1 wherein the substrate is substantially flat, wherein the first conductor is a metal layer over the substrate, wherein the semiconductor particles have an average diameter less than 300 microns, and wherein the step of depositing the plurality of semiconductor particles on the substrate comprises printing the semiconductor particles on the metal layer.

11. The process of Claim 10 wherein the semiconductor particles are randomly located over the metal layer.

12. The process of Claim 1 wherein the step of depositing the plurality of semiconductor particles, the step of providing the first conductor, the step of depositing the first layer, and the step of depositing the second conductor are all performed by printing.

13. The process of Claim 1 wherein there are no masking steps involved in the process.

14. The process of Claim 1 wherein the step of depositing the dielectric layer over the first conductor comprises also depositing the dielectric layer over the top surface portion of the particles and wicking substantially all of the dielectric layer off the top surface portion by capillary action so as to pool along the edges of the particles.

15. The process of Claim 1 wherein the step of heating the first layer of material to dope the top surface portion with the dopants of the second conductivity type comprises heating the first layer of material using a laser.

16. A solar cell structure comprising:
a substrate;
a plurality of semiconductor particles on the substrate, the particles having a top surface portion for being exposed to the sun to generate electricity and having a bottom surface portion, the particles being of a first conductivity type with the top surface portion of the particles being doped, in-situ, to be a second conductivity type, the top surface portion having no doping layer over it;
a first conductor electrically contacting the bottom surface portion, the bottom surface portion having the first conductivity type;
a dielectric layer over the first conductor; and
a second conductor over the dielectric layer electrically contacting the top surface portion.
wherein, the semiconductor particles are a plurality of diodes adapted to convert sunlight to electricity.

17. The structure of Claim 16 wherein the first conductor is a metal layer and the semiconductor particles are assembled in a monolayer over the metal layer.

18. The structure of Claim 16 wherein the top surface portion is doped with n-type dopants and the bottom surface portion is p-type.

19. The structure of Claim 16 wherein the semiconductor particles are substantially spherical and have an average diameter less than 300 microns.

20. The structure of Claim 16 wherein the second conductor is a transparent conductor.

21. The structure of Claim 16 wherein the substrate is a dielectric and the first conductor is a metal layer over the substrate.

WICKING DIELECTRIC LAYER OFF TOPS OF SEMICONDUCTOR SPHERES AND DOPING EXPOSED SPHERES IN PV PANEL. FIGS. 6-10. Tricia A. Youngbull, Theodore I. Kamins, Richard A. Blanchard.

1. A process for forming a solar cell structure comprising:
depositing a plurality of semiconductor particles on a substrate at atmospheric pressure, the particles having a top surface portion for being exposed to the sun to generate electricity and having a bottom surface portion;
providing a first conductor electrically contacting the bottom surface portion, the bottom surface portion having a first conductivity type;
depositing a dielectric layer over the first conductor and over the top surface portion of the particles;
wicking substantially all of the dielectric layer off the top surface portion of the particles by capillary action so as to pool along the edges of the particles;
depositing a first layer of material over the top surface portion at atmospheric pressure, the first layer of material containing dopants of a second conductivity type;
heating the first layer of material to dope the top surface portion with the dopants of the second conductivity type;
removing the first layer of material at atmospheric pressure; and
depositing a second conductor over the dielectric layer electrically contacting the top surface portion.

2. The process of Claim 1 wherein the step of heating the first layer of material to dope the top surface portion with the dopants of the second conductivity type comprises heating the first layer of material using a laser.

What is claimed is:

1. A solar cell structure comprising:
one or more diodes on a substrate adapted to convert sunlight to electricity, the diodes having a first surface portion for being exposed to the sun, the diodes having an outer surface being formed of a first material having a first index of refraction;
a first lens layer overlying the first surface portion, the first lens layer comprising transparent first particles in a first binder material, the first particles having an average first diameter less than 300 nm, the first particles having a second index of refraction less than the first index of refraction, wherein the second index of refraction is greater than an index of refraction of the first binder material, such that an index of refraction of the first lens layer is less than the first index of refraction; and
a second lens layer overlying the first lens layer, the second lens layer comprising transparent second particles in a second binder material, the second particles having an average second diameter greater than 1 micron, the second particles having a third index of refraction less than the second index of refraction, the third index of refraction being substantially the same as the index of refraction of the second binder material, the second particles being harder than the second binder material to provide abrasion resistance and resistance to moisture.

2. The structure of claim 1 wherein the first particles have an average diameter between 50-300 nm.

3. The structure of claim 1 wherein the first particles have an index of refraction greater than or equal to 1.7.

4. The structure of claim 3 wherein the first particles are doped to have an index of refraction between 1.7-2.4.

5. The structure of claim 3 wherein the first particles are infused in a first polymer having an index of refraction less than 1.7.

6. The structure of claim 3 wherein the second particles have an index of refraction of less than or equal to 1.43.

7. The structure of claim 3 wherein the second particles are infused in a second polymer having an index of refraction approximately equal to the index of refraction of the second particles.

8. The structure of claim 1 wherein the second lens layer forms an approximately hemispherical lens.

9. The structure of claim 1 further comprising one or more additional lens layers having different indices of refraction to create a finer graded lens to further reduce reflection.

10. The structure of claim 1 wherein the first particles and the second particles are doped glass particles.

11. The structure of claim 1 further comprising a quantum dot layer deposited over the first surface portion, the quantum dot layer converting the sunlight's UV wavelengths to emitted visible wavelengths, wherein the one or more diodes convert the emitted visible wavelengths to electricity, wherein the first lens layer and the second lens layer are formed over the quantum dot layer.

12. The structure of claim 1 wherein the one or more diodes comprises a plurality of silicon spheres on a substrate, the diodes having a top surface of a first conductivity type and a bottom surface of a second conductivity type, the first lens layer and the second lens layer being deposited over the top surface of the diodes.

13. The structure of claim 1 wherein the first lens layer conforms to contours of the first surface portion of the diodes, and wherein the second lens layer conforms to a top surface of the first lens layer.

14. A method of forming a solar cell structure comprising:
depositing a plurality of silicon diodes on a substrate adapted to convert sunlight to electricity, the diodes having a first surface portion for being exposed to the sun, the diodes having an outer surface being formed of a first material having a first index of refraction;
depositing a first lens layer overlying the first surface portion, the first lens layer comprising transparent first particles in a first binder material, the first particles having an average first diameter less than 300 nm, the first particles having a second index of refraction less than the first index of refraction, wherein the second index of refraction is greater than an index of refraction of the first binder material, such that an index of refraction of the first lens layer is less than the first index of refraction; and
depositing a second lens layer overlying the first lens layer, the second lens layer comprising transparent second particles in a second binder material, the second particles having an average second diameter greater than 1 micron, the second particles having a third index of refraction less than the second index of refraction, the third index of refraction being substantially the same as the index of refraction of the second binder material, the second particles being harder than the second binder material to provide abrasion resistance and resistance to moisture.

15. The method of claim 14 wherein the first particles have an average diameter between 20-300 nm.

16. The method of claim 14 wherein the first particles have an index of refraction greater than or equal to 1.7.

17. The method of claim 14 wherein the first particles are doped to have an index of refraction of about 1.7-1.9.

18. The method of claim 14 wherein the first particles are infused in a first polymer having an index of refraction less than 1.7.

19. The method of claim 14 wherein the second particles have an index of refraction of less than or equal to 1.43.

20. The method of claim 14 wherein the second particles are infused in a second polymer having an index of refraction approximately equal to the index of refraction of the second particles.

21. The method of claim 14 wherein the second lens layer forms an approximately hemispherical lens.

22. The method of claim 14 wherein the first particles and the second particles are doped glass particles.

23. The method of claim 14 further comprising depositing a quantum dot layer over the first surface portion, the quantum dot layer converting the sunlight's UV wavelengths to emitted visible wavelengths, wherein the one or more diodes convert the emitted visible wavelengths to electricity, wherein the first lens layer and the second lens layer are formed over the quantum dot layer.

* * * * *